US011059278B2

(12) United States Patent
Arias et al.

(10) Patent No.: US 11,059,278 B2
(45) Date of Patent: Jul. 13, 2021

(54) TWO-PHASE THERMAL MANAGEMENT DEVICES, METHODS, AND SYSTEMS

(71) Applicant: Roccor, LLC, Longmont, CO (US)

(72) Inventors: Diego Arias, Longmont, CO (US); William Francis, Lyons, CO (US); Michael Hulse, Erie, CO (US); Steven Isaacs, Fort Collins, CO (US); Mario Saldana, Thornton, CO (US); Greg Shoukas, Denver, CO (US)

(73) Assignee: Roccor, LLC, Longmont, CO (US)

( * ) Notice: Subject to any disclaimer, the term of this patent is extended or adjusted under 35 U.S.C. 154(b) by 705 days.

(21) Appl. No.: 15/444,473

(22) Filed: Feb. 28, 2017

(65) Prior Publication Data

US 2017/0246850 A1    Aug. 31, 2017

Related U.S. Application Data

(60) Provisional application No. 62/300,885, filed on Feb. 28, 2016.

(51) Int. Cl.
*B32B 37/10*    (2006.01)
*B32B 37/06*    (2006.01)
(Continued)

(52) U.S. Cl.
CPC ............ *B32B 37/1018* (2013.01); *B32B 5/18* (2013.01); *B32B 37/06* (2013.01); *B32B 2307/30* (2013.01);
(Continued)

(58) Field of Classification Search
CPC ........... H05K 7/20218; H05K 7/20836; H05K 7/20381
See application file for complete search history.

(56) References Cited

U.S. PATENT DOCUMENTS 5,343,940 A    9/1994    Jean
6,105,662 A    8/2000    Suzuki
(Continued)

FOREIGN PATENT DOCUMENTS

WO    WO2010056792    5/2010

OTHER PUBLICATIONS

Thompson, S., et al., "Additive manufacturing of heat exchangers: A case study on a multi-layered Ti-6Al-4V oscillating heat pipe," Additive Manufacturing 8 (2015) pp. 163-174.
(Continued)

*Primary Examiner* — Christopher T Schatz
(74) *Attorney, Agent, or Firm* — Wilson Patent Law, LLC

(57) ABSTRACT

Devices, methods, and systems for two-phase thermal management are provided in accordance with various embodiments. For example, a two-phase thermal management device is provided that may include two or more containment layers and/or one or more porous layers positioned between at least a portion of each of the two or more containment layers. The portion of each of the two or more containment layers and the one or more porous layers may be bonded with each other. The two or more containment layers and one or more porous layers may be bonded with each other to form an uninterrupted stack of material layers utilizing diffusion bonding. Some embodiments include a method of forming a two-phase thermal management device including arranging multiple materials layers including one or more porous layers positioned with respect to one or more containment layers; and/or bonding the multiple material layers with each other.

10 Claims, 28 Drawing Sheets

(51) Int. Cl.
*B32B 5/18* (2006.01)
*H05K 7/20* (2006.01)

(52) U.S. Cl.
CPC ...... *B32B 2309/02* (2013.01); *H05K 7/20209* (2013.01); *H05K 7/20218* (2013.01); *H05K 7/20381* (2013.01); *H05K 7/20836* (2013.01)

(56) References Cited

U.S. PATENT DOCUMENTS

| | | | |
|---|---|---|---|
| 6,123,973 | A * | 9/2000 | Kuhn .................. A21D 2/14 426/532 |
| 6,257,328 | B1 | 7/2001 | Fujiwara |
| 6,446,706 | B1 | 9/2002 | Rosenfeld |
| 6,680,044 | B1 * | 1/2004 | Tonkovich ............ B01J 12/007 423/652 |
| 7,663,883 | B2 | 2/2010 | Shirakami |
| 7,799,428 | B2 | 9/2010 | Fujiwara |
| 8,069,907 | B2 | 12/2011 | Bryant |
| 8,921,702 | B1 | 12/2014 | Carter |
| 9,374,904 | B2 | 6/2016 | Francis |
| 9,723,735 | B1 | 8/2017 | Andres |
| 9,799,814 | B2 | 10/2017 | Francis |
| 10,458,716 | B2 | 10/2019 | Hulse |
| 2003/0152488 | A1 * | 8/2003 | Tonkovich ............ B01F 5/0604 422/400 |
| 2005/0039879 | A1 | 2/2005 | Hanai |
| 2006/0098411 | A1 | 5/2006 | Lee |
| 2008/0087456 | A1 | 4/2008 | Schuette |
| 2008/0296354 | A1 * | 12/2008 | Crockett ............ B23K 20/24 228/193 |
| 2009/0128935 | A1 | 5/2009 | Nishino |
| 2010/0038660 | A1 | 2/2010 | Shuja |
| 2011/0017431 | A1 | 1/2011 | Yang |
| 2011/0103011 | A1 | 5/2011 | Koplow |
| 2013/0010464 | A1 | 1/2013 | Shuja |
| 2013/0049040 | A1 | 2/2013 | Ramer |
| 2014/0265810 | A1 | 9/2014 | Livesay |
| 2014/0268780 | A1 | 9/2014 | Wang |
| 2015/0167951 | A1 | 6/2015 | Garelli |
| 2015/0188019 | A1 | 7/2015 | Corrado |
| 2016/0123678 | A1 | 5/2016 | Hulse |
| 2016/0341486 | A1 | 11/2016 | Kim |
| 2016/0363378 | A1 | 12/2016 | Hitzelberger |
| 2017/0064868 | A1 | 3/2017 | Rush |
| 2017/0082372 | A1 | 3/2017 | Vos |
| 2017/0205150 | A1 | 7/2017 | Safford-Smith |
| 2018/0045471 | A1 | 2/2018 | Dietrich |
| 2018/0106564 | A1 | 4/2018 | Isaacs |
| 2018/0159011 | A1 | 6/2018 | Francis |
| 2019/0204016 | A1 | 7/2019 | Hulse |

OTHER PUBLICATIONS

Hall, S. Rules of Thumb for Chemical Engineers (5th Edition)—2.18 Thermal Conductivity of Metals. (2012) pp. 27-57.
Hill, S., et al., "Thermal Management Systems Roadmap, Technology Area 14," NASA, Apr. 2012.
Ziaei, S., et al., "Constructal design for convection melting of a phase change body" International Journal of Heat and Mass Transfer, 99 (2016), pp. 762-769.
Choi, M., "Paraffin Phase Change Material for Maintaining Temperature Stability of IceCube Type of CubeSats in LEO," 13th International Energy Conversion Engineering Conference, Jul. 2015, pp. 1-22.
Hengeveld, D., et al., Hot- and Cold-Case Orbits for Robust Thermal Control, J. Spacecraft and Rockets, vol. 46, No. 6, 2009, pp. 1249-1260.
Lee, S.A., et al., "Thermal Vacuum Test of Ice as a Phase Change Material Integrated with a Radiator", 40th International Conference on Environmental Systems, Jul. 2010, pp. 1-10.
Choi, M., "Phase Change Material for Temperature Control of Imager or Sounder on GOES Type Satellites in GEO," 44th International Conference on Environmental Systems, Jul. 13-17, 2014, pp. 1-9.
Peyrou-Lauga, R., et al., "Phase Change Material Heat Storage Devices for Launchers and Orbiting Systems," 45th International Conference on Environmental Systems, Jul. 12-16, 2015, pp. 1-13.
Yamada, K., et al., "Heat Storage Panel Using a Phase-Change Material Encapsulated in a High-thermal conductivity CFRP for Micro Satellites," 44th International Conference on Environmental Systems, Jul. 13-17, 2014, pp. 1-12.

* cited by examiner

TWO-PHASE THERMAL MANAGEMENT DEVICES, METHODS, AND SYSTEMS

CROSS-REFERENCES TO RELATED APPLICATIONS

This application is a non-provisional patent application claiming priority benefit of U.S. provisional patent application Ser. No. 62/300,885, filed on Feb. 28, 2016 and entitled "TWO-PHASE THERMAL TRANSPORT DEVICES, METHODS, AND SYSTEMS," the entire disclosure of which is herein incorporated by reference for all purposes.

GOVERNMENT LICENSE RIGHTS

This invention was made with Government support under Contract FA9451-15-C-0420 awarded by the United States Air Force. The Government has certain rights in the invention.

BACKGROUND

Elevated temperatures may generally lower reliability in electronic devices. In some situations, such as spacecraft electronics, screening and thermal derating along with thermal control system design may be utilized to maintain electronic temperatures within specified limits. However, these approaches may be expensive, time-consuming, or may add unintended mass.

There may be a need for new tools and techniques to more efficiently provide for thermal management for electronics or other sources, in particular with regard to small satellite systems, direct energy systems, and/or diode laser systems.

SUMMARY

Devices, methods, and systems for two-phase thermal management are provided in accordance with various embodiments. For example, a two-phase thermal management device is provided that may include two or more containment layers and/or one or more porous layers positioned between at least a portion of each of the two or more containment layers. The portion of each of the two or more containment layers and the one or more porous layers may be bonded with each other.

In some embodiments, the two or more containment layers and one or more porous layers are bonded with each other to form an uninterrupted stack of material layers. The two or more containment layers and one or more porous layers may be bonded with each other such that a first side of each respective porous layer from the one or more porous layers and a second side of each respective porous layer from the one or more porous layers are each respectively bonded with at least a side of one of the two or more containment layers or a side of one of the other one or more porous layers. In some embodiments, the two or more containment layers and the one or more porous layers may be bonded with each other such that: a first side of a first containment layer from the two or more containment layers is bonded with a first side of a first porous layer from the one or more porous layers; and/or a first side of a second containment layer from the two or more containment layers is bonded with at least a second side of the first porous layer or a first side of a second porous layer from the one or more porous layers, where a second side of the second porous layer is bonded with at least the second side of the first porous layer or one or more additional porous layers from the one or more porous layers such that at least one of the additional porous layers is bonded with the second side of the first porous layer.

In some embodiments, the two or more containment layers and the one or more porous layers are diffusion bonded with each other. Some embodiments include a working fluid disposed between the two or more containment layers. The working fluid may include at least ammonia, acetone, methanol, water, or ethyl alcohol. In some embodiments, the working fluid includes paraffin.

In some embodiments, the two or more containment layers and the one or more porous layers are made from one or more flexible materials. In some embodiments, the one or more porous layers include at least a first liquid wicking layer and a vapor layer positioned between the first liquid wicking layer and at least one of the two or more containment layers. In some embodiments, the one or more porous layers includes a second liquid wicking layer positioned such that the vapor layer is positioned between the first liquid wicking layer and the second liquid wicking layer. In some embodiments, the first liquid wicking layer includes a first copper mesh, the second liquid wicking layer includes a second copper mesh, and the vapor layer includes at least a third mesh or a metal foam; the third mesh may include fewer wires per unit length than the first mesh or the second mesh. In some embodiments, the two or more containment layers include a first copper foil and a second copper foil. In some embodiments, the two or more containment layers include at least a copper foil, an aluminum foil, a stainless steel foil, or a titanium foil.

In some embodiments, the two or more containment layers include a first containment layer, a second containment layer, and a third containment layer; and/or the one or more porous layers include at least a first porous layer positioned between at least a portion of the first containment layer and a portion of the second containment layer and at least a second porous layer positioned between at least a portion of the second containment layer and at least a portion of the third containment layer. The first containment layer, the second containment layer, and the third containment layer may be stacked with respect to each other perpendicularly to a main plane. The first containment layer and the third containment layer may be skewed with respect to each other.

In some embodiments, the one or more porous layers include a first mesh layer, a second mesh layer, a third mesh layer, and a fourth mesh layer. The first mesh layer and the third mesh layer may include fewer wires per unit length than the second mesh layer and the fourth mesh layer. In some embodiments, at least a portion of the first mesh layer is positioned between the second mesh layer and a first containment layer from the two or more containment layers. In some embodiments, at least a portion of the third mesh layer is positioned between the fourth mesh layer and a second containment layer from the two or more containment layers. Some embodiments may further include a fifth mesh layer positioned between the second mesh layer and the fourth mesh layer; the fifth mesh layer may include fewer wires per unit length than the first mesh layer, the second mesh layer, the third mesh layer, and the fourth mesh layer. Some embodiments may include a window aperture positioned between the containment layers.

In some embodiments, the device is configured for space applications. In some embodiments, the device is configured to maintain its shape when exposed to an internal pressure greater than an external pressure. In some embodiments, the device is configured to carry an internal vapor pressure of the working fluid greater than an external pressure. In some embodiments, the device is configured with one or more evaporator regions and one or more condenser regions.

In some embodiments, the device is configured to passively move the working fluid located between the two or more containment layers. In some embodiments, another portion of a first containment layer from the two or more containment layers and another portion of a second containment layer from the two or more containment layers are bonded with each other to form one or more seals for the device. In some embodiments, the one or more porous layers include at least two porous layers that partially overlap.

Some embodiments include a first working fluid and a second working fluid, where the device may be configured to: passively move the first working fluid located between a first containment layer from the two or more containment layers and a second containment layer from the two or more containment layers; and/or actively move the second working fluid located between the second containment layer and a third containment layer from the two or more containment layers.

Some embodiments include a method of forming a two-phase thermal management device. The method may include: arranging multiple materials layers including one or more porous layers positioned with respect to one or more containment layers; and/or bonding the multiple material layers with each other. In some embodiments, bonding the multiple material layers with each other occurs at least simultaneously or in a single manufacturing step.

In some embodiments, bonding the multiple material layers with each other utilizes diffusion bonding, which may also be known as thermo-compression bonding. The diffusion bonding may include at least heating the multiple material layers or applying compressive pressure to the multiple material layers. Heating the multiple material layers may include heating the multiple layers to a temperature between 56% and 86% of a melting temperature of the multiple material layers. In some embodiments, heating the multiple material layers includes heating the multiple layers to a temperature greater than or equal to 850 degrees Celsius. Applying compressive pressure to the multiple material layers may include applying a pressure greater than or equal to 1,000 psi. In some embodiments, at least the heating or the compressive pressure applying occurs for 20 minutes or longer.

Some embodiments include sealing one or more edges of the two or more containment layers to one another. Some embodiments include utilizing a vacuum hot press to bond the multiple material layers with each other.

Some embodiments include utilizing a charging tube between the two or more containment layers. Some embodiments include: injecting a working fluid between the two or more containment layers; and/or sealing at least a portion of the two or more containment layers with respect to a position of the charging tube between the two or more containment layers. In some embodiments, the working fluid includes at least ammonia, acetone, methanol, water, or ethyl alcohol. In some embodiments, the working fluid includes paraffin. Some embodiments include evacuating the two-phase thermal management device before injecting the working fluid between the two or more containment layers.

In some embodiments, arranging the multiple material layers includes: positioning a first porous layer from the one or more porous layers between a first containment layer from the one or more containment layers and a second porous layer from the one or more porous layers; and/or positioning a third porous layer from the one or more porous layers between the second porous layer and a second containment layer from the one or more containment layers. In some embodiments, the first porous layer and the third porous layer include more wires per unit length than the second porous layer.

In some embodiments, arranging the multiple material layers includes: positioning a first porous layer from the one or more porous layers between a first containment layer from the one or more containment layers and a second porous layer from the one or more porous layers; and/or positioning a third porous layer from the one or more porous layers between a fourth porous layer and a second containment layer from the one or more containment layers. In some embodiments, bonding the multiple material layers with each other includes: bonding the first porous layer from the one or more porous layers with the first containment layer from the one or more containment layers and the second porous layer from the one or more porous layers to form a first wicking structure; bonding the third porous layer from the one or more porous layers with the fourth porous layer and the second containment layer from the one or more containment layers to form a second wicking structure; and/or bonding the first wicking structure and the second wicking structure with each other, where at least a fifth porous structure or a vapor structure is positioned between the first wicking structure and the second wicking structure. In some embodiments, the first porous layer and the third porous layer include fewer wires per unit length than the second porous layer and the fourth porous layer. In some embodiments, the fifth porous structure includes fewer wires per unit length than at least the first porous layer, the second porous layer, the third porous layer, or the fourth porous layer.

Some embodiments include a two-phase thermal management system. The system may include a first two-phase thermal management device that may include: a first containment layer and a second containment layer; and/or one or more porous layers positioned between at least a portion of each of the first containment layer and the second containment layer. The system may include a second two-phase thermal management device coupled with the first two-phase thermal management device, where the second two-phase thermal management device may include: a third containment layer and a forth containment layer; and/or one or more porous layers positioned between at least a portion of each of the third containment layer and the fourth containment layer.

In some embodiments, the second containment layer of the first two-phase thermal management device is continuous with the third containment layer of the second two-phase thermal management device. Some embodiments include a third two-phase thermal management device coupled with the first two-phase thermal management device and the second two-phase thermal management device, where the first two-phase thermal management device and the second two-phase thermal management device are configured to couple with one or more heat sources and the third two-phase thermal management device is configured to couple with a heat sink.

Some embodiments include a condenser region of the first two-phase thermal management device that overlaps with an evaporator region of the second two-phase thermal management device.

In some embodiments, the multiple layers of the first two-phase thermal management device are diffusion bonded with each other and the multiple layers of the second two-phase thermal management device are diffusion bonded with each other. In some embodiments, a first working fluid disposed between the first containment layer and the second containment layer of the first two-phase thermal management device and a second working fluid disposed between the third containment layer and the fourth containment layer of the second two-phase thermal management device. In some embodiments, the first working fluid includes at least ammonia, acetone, methanol, water, ethyl alcohol, or paraffin and the second working fluid includes at least ammonia, acetone, methanol, water, ethyl alcohol, or paraffin. In some embodiments, the first containment layer, the second containment layer, the third containment layer, and the fourth containment are made from one or more flexible materials.

Some embodiments include methods, systems, and/or devices as described in the specification and/or shown in the figures.

The foregoing has outlined rather broadly the features and technical advantages of embodiments according to the disclosure in order that the detailed description that follows may be better understood. Additional features and advantages will be described hereinafter. The conception and specific embodiments disclosed may be readily utilized as a basis for modifying or designing other structures for carrying out the same purposes of the present disclosure. Such equivalent constructions do not depart from the spirit and scope of the appended claims. Features which are believed to be characteristic of the concepts disclosed herein, both as to their organization and method of operation, together with associated advantages will be better understood from the following description when considered in connection with the accompanying figures. Each of the figures is provided for the purpose of illustration and description only, and not as a definition of the limits of the claims.

BRIEF DESCRIPTION OF THE DRAWINGS

A further understanding of the nature and advantages of different embodiments may be realized by reference to the following drawings. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

This description provides embodiments, and is not intended to limit the scope, applicability or configuration of the disclosure. Rather, the ensuing description will provide those skilled in the art with an enabling description for implementing embodiments of the disclosure. Various changes may be made in the function and arrangement of elements.

Thus, various embodiments may omit, substitute, or add various procedures or components as appropriate. For instance, it should be appreciated that the methods may be performed in an order different than that described, and that various stages may be added, omitted or combined. Also, aspects and elements described with respect to certain embodiments may be combined in various other embodiments. It should also be appreciated that the following systems, devices, and methods may individually or collectively be components of a larger system, wherein other procedures may take precedence over or otherwise modify their application.

Devices, methods, and systems for two-phase thermal management are provided in accordance with various embodiments. Some embodiments may include two-phase thermal management devices that may be configured for thermal transport and/or thermal storage, for example. Two-phase thermal management devices in accordance with various embodiments may be configured to be conformable or rigid. Some embodiments include architectures for flexible heat straps or rigid heat spreaders, for example.

For example, some embodiments may include flexible two-phase thermal management devices, systems, and methods. Different embodiments may provide for efficient, flat, lightweight, and conformable two-phase thermal straps that may be specifically designed for different applications, such as space applications. Different embodiments may be tailored based on operating temperature, heat load, heat flux, and/or geometry. Embodiments may provide different benefits, such as uniform heat distribution, light weight, isothermal heat acquisition, one or more heat loads per device, and/or solutions for designs in which thermal consideration may be secondary. Embodiments may utilize readily available materials, may involve scalable manufacturing methods, may utilize different fluids and/or phase-change materials for matching operating temperatures, and/or may provide for advance thermal analysis capabilities.

Some embodiments include rigid two-phase thermal management devices, systems, and methods. Different embodiments may provide micro-scale, flat two-phase thermal management devices that may spread waste heat, for example. These tools and techniques may be applicable for high heat flux situations (e.g., high-power solid state lasers).

Figure 1:
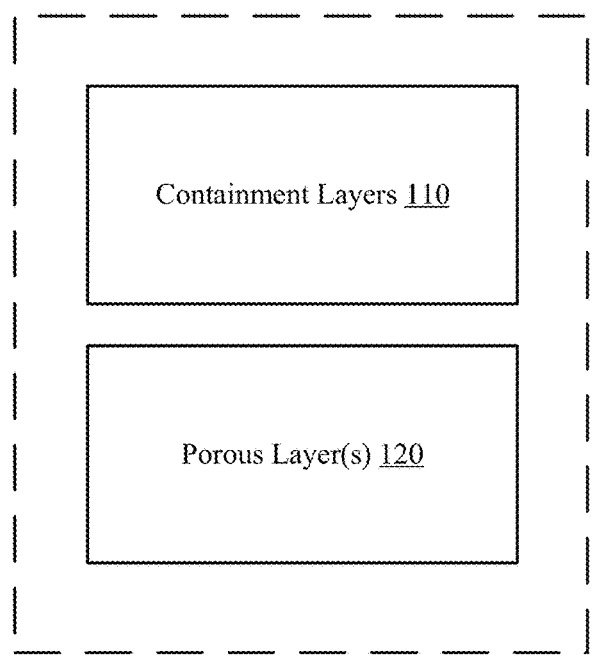
FIG. 1 shows a device in accordance with various embodiments.

Two-phase thermal management devices, methods, and systems are provided in accordance with various embodiments. For example, FIG. 1 shows a two-phase thermal management device 100 in accordance with various embodiments. Device 100 may have two or more containment layers 110 and one or more porous layers 120. The two or more containment layers 110 and one or more porous layers 120 may be bonded with each other to form an uninterrupted stack of material layers.

The two or more containment layers 110 and one or more porous layers 120 may be bonded with each other such that a first side of each respective porous layer from the one or more porous layers 120 and a second side of each respective porous layer from the one or more porous layers 120 may each be respectively bonded with at least a side of one of the two or more containment layers 110 or a side of one of the other one or more porous layers 120.

In some embodiments of device 100, the two or more containment layers 110 and the one or more porous layers 120 are bonded with each other such that a first side of a first containment layer from the two or more containment layers 110 is bonded with a first side of a first porous layer from the one or more porous layers 120. A first side of a second containment layer from the two or more containment layers 110 may be bonded with at least a second side of the first porous layer or a first side of a second porous layer from the one or more porous layers 120. A second side of the second porous layer may be bonded with at least the second side of the first porous layer or one or more additional porous layers from the one or more porous layers 120 such that at least one of the additional porous layers may be bonded with the second side of the first porous layer.

In some embodiments of device 100, the two or more containment layers 110 and the one or more porous layers 120 are diffusion bonded with each other. Some embodiments of device 100 include a working fluid disposed between the two or more containment layers 110. The working fluid may include at least ammonia, acetone, methanol, water, or ethyl alcohol. The working fluid may include a variety of refrigerants in general. In some embodiments, the working fluid may include different cryogenic liquids, such as liquid nitrogen, liquid helium, or liquid hydrogen, for example. Some embodiments may utilize working fluids suitable for high temperature applications, such as liquid sodium or other liquid metals. In some embodiments, the working fluid includes paraffin.

In some embodiments of device 100, the two or more containment layers 110 and the one or more porous layers 120 are made from one or more flexible materials. For example, one or more porous layers 120 may include at least a first liquid wicking layer and a vapor layer positioned between the first liquid wicking layer and at least one of the two or more containment layers 110. In some embodiments, the one or more porous layers 120 includes a second liquid wicking layer positioned such that the vapor layer is positioned between the first liquid wicking layer and the second liquid wicking layer. In some embodiments of device 100, the first liquid wicking layer includes a first copper mesh, the second liquid wicking layer includes a second copper mesh, and the vapor layer includes at least a third copper mesh or a copper foam; the third mesh may include fewer wires per unit length than the first mesh or the second mesh. In some embodiments of device 100, the two or more containment layers 110 include a first copper foil and a second copper foil. In some embodiments of device 100, the two or more containment layers 110 include at least a copper foil, an aluminum foil, a stainless steel foil, or a titanium foil.

In some embodiments of device 100, the two or more containment layers 110 include a first containment layer, a second containment layer, and a third containment layer. The one or more porous layers 120 may include at least a first porous layer positioned between at least a portion of the first containment layer and a portion of the second containment layer and at least a second porous layer positioned between at least a portion of the second containment layer and at least a portion of the third containment layer. The first containment layer, the second containment layer, and the third containment layer may be stacked with respect to each other perpendicularly to a main plane in some embodiments. The first containment layer and the third containment layer may be skewed with respect to each other in some embodiments.

In some embodiments, the one or more porous layers 120 include a first mesh layer, a second mesh layer, a third mesh layer, and a fourth mesh layer. The first mesh layer and the third mesh layer may include fewer wires per unit length than the second mesh layer and the fourth mesh layer. In some embodiments, at least a portion of the first mesh layer is positioned between the second mesh layer and a first containment layer from the two or more containment layers 110. In some embodiments, at least a portion of the third mesh layer is positioned between the fourth mesh layer and a second containment layer from the two or more containment layers 110. Some embodiments may further include a fifth mesh layer positioned between the second mesh layer and the fourth mesh layer; the fifth mesh layer may include fewer wires per unit length than the first mesh layer, the second mesh layer, the third mesh layer, and the fourth mesh layer. Some embodiments may include a window aperture positioned between the two or more containment layers 110.

In some embodiments, device 100 is configured for space applications. In some embodiments, device 100 is configured to maintain its shape when exposed to an internal pressure greater than an external pressure. In some embodiments, device 100 is configured to carry an internal vapor pressure of the working fluid greater than an external pressure. In some embodiments, the device is configured with one or more evaporator regions and one or more condenser regions.

In some embodiments, device 100 is configured to passively move the working fluid located between the two or more containment layers. In some embodiments, another portion of a first containment layer from the two or more containment layers 110 and another portion of a second containment layer of the two or more containment layers 110 are bonded with each other to form one or more seals for the device. In some embodiments, the one or more porous layers include at least two porous layers that partially overlap.

Some embodiments of device 100 include a first working fluid and a second working fluid, where the device is configured to passively move the first working fluid located between a first containment layer from the two or more containment layers 110 and a second containment layer from the two or more containment layers 110. Device 100 may be configured to actively move the second working fluid located between the second containment layer and a third containment layer from the two or more containment layers 110.

Figure 2A:
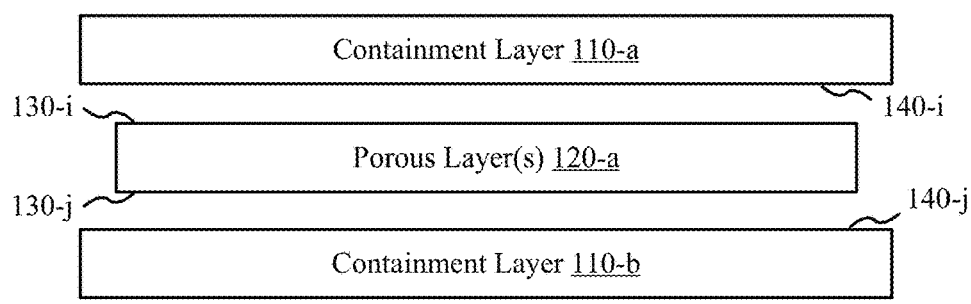
FIG. 2A shows a device in accordance with various embodiments.
Figure 2B:
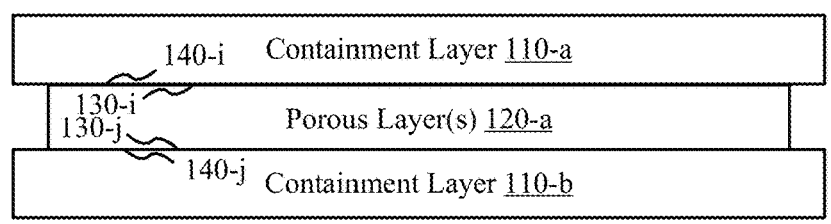
FIG. 2B shows a device in accordance with various embodiments.

FIG. 2A and FIG. 2B show device 200-*a* and device 200-*b* in accordance with various embodiments. Device 200-*a* and device 200-*b* may be examples of device 100 of FIG. 1. Furthermore, device 200-*a* and device 200-*b* may be related to each other as showing different stages of assembly of the device.

Device 200-*a* and device 200-*b* may have two or more containment layers 110-*a* and 110-*b* and one or more porous layers 120-*a*. As shown in FIG. 2A, the two or more containment layers 110-*a* and 110-*b* and the one or more porous layers 120-*a* may be arranged with respect to each other. As shown in FIG. 2B, the two or more containment layers 110-*a* and 110-*b* and one or more porous layers 120-*a* may be bonded with each other to form an uninterrupted stack of material layers.

Figure 2C:
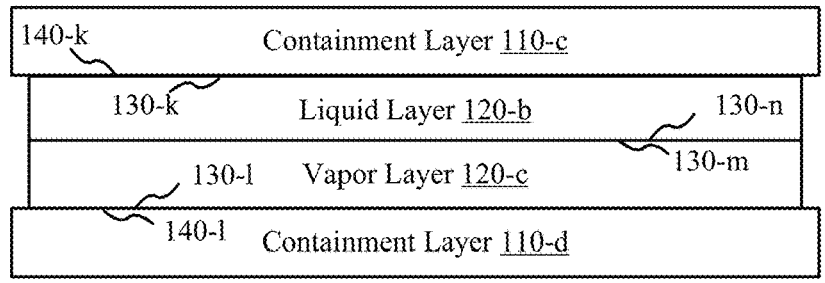
FIG. 2C shows a device in accordance with various embodiments.
Figure 2D:
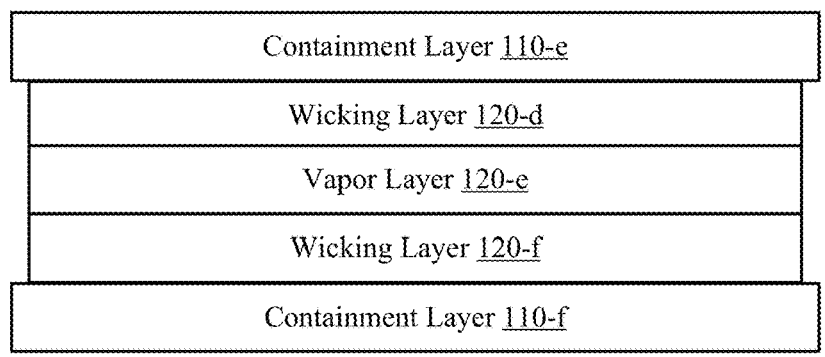
FIG. 2D shows a device in accordance with various embodiments.

For example, the two or more containment layers 110-*a* and 100-*b* and one or more porous layers 120-*a* may be bonded with each other such that a first side 130-*i* of each respective porous layer from the one or more porous layers 120-*a* and a second side 130-*j* of each respective porous layer from the one or more porous layers 120-*a* may each be respectively bonded with at least a side 140-*i*, 140-*j* of one of the two or more containment layers 110 or a side of one of the other one or more porous layers 120-*a* (see, e.g., FIG. 2C and/or FIG. 2D).

FIG. 2C and FIG. 2D show device 200-*c* and device 200-*d*, respectively in accordance with various embodiments. Device 200-*c* and/or device 200-*d* may be examples of device 100 of FIG. 1 and/or device 200-*b* of FIG. 2B. For example, device 200-*c* may be example of device 200-*b* where the one or more porous layers 120-*a* of device 200-*b* may include a liquid layer 120-*b* and/or a vapor layer 120-*c* as shown in device 200-*c*. The liquid layer 120-*b* may be referred to as a liquid wicking layer in some embodiments. Similarly, device 200-*d* may be example of device 200-*b* where the one or more porous layers 120-*a* of device 200-*b* may include a first wicking layer 120-*d*, a vapor layer 120-*e*, and/or a second wicking layer 120-*f*. The first wicking layer 120-*d* and the second wicking layer 120-*f* may be examples of liquid layer 120-*b* of device 200-*c*. Furthermore, device 200-*c* may have two or more containment layers 110-*c* and 110-*d*; device 200-*d* may have two or more containment layers 110-*e* and 110-*f*. As shown in both FIGS. 2C and 2D, the two or more containment layers 110-*c*/110-*d* and 110-*e*/110-*f*, respectively, and one or more porous layers 120-*b*/120-*c* and 120-*d*/120-*e*/120-*f*, respectively, may be bonded with each other to form an uninterrupted stack of material layers.

Figure 2E:
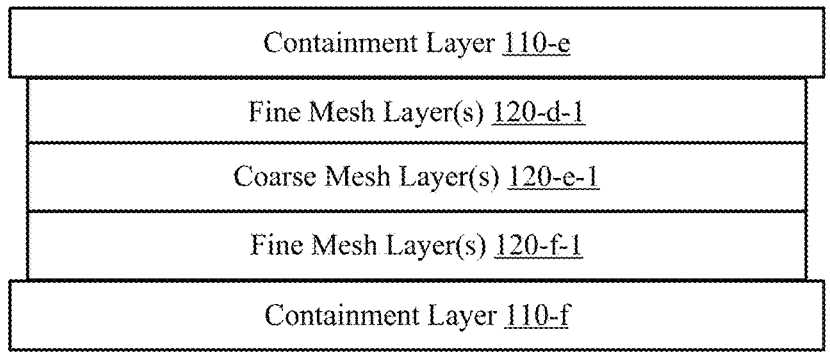
FIG. 2E shows a device in accordance with various embodiments.

With respect to device 200-*c*, the two or more containment layers 110-*c* and 110-*d* and the one or more porous layers 120-*b* and 120-*c* may be bonded with each other such that a first side 140-*k* of first containment layer 110-*c* from the two or more containment layers may bonded with a first side 130-*k* of a first porous layer (shown as liquid layer 120-*b*) from the one or more porous layers. A first side 140-*l* of second containment layer 110-*d* from the two or more containment layers may be bonded with at least a second side of the first porous layer or a first side 130-*l* of a second porous layer (shown as vapor layer 120-*c*) from the one or more porous layers. A second side 130-*m* of the second porous layer 120-*c* may be bonded with at least the second side 130-*n* of the first porous layer 120-*b* or one or more additional porous layers from the one or more porous layers 120 such that at least one of the additional porous layers may be bonded with the second side 130-*n* of the first porous layer. Device 200-*d* may include a similar bonding configuration with respect to the first containment layer 110-*e*, the second containment layer 120-*f*, the first wicking layer 120-*d*, the vapor layer 120-*e*, and/or second wicking layer 120-*f*. In some embodiments, the first liquid wicking layer 120-*d* includes a first fine copper mesh, the second liquid wicking layer 120-*f* includes a second fine copper mesh, and the vapor layer 120-*e* includes at least a coarse copper mesh or copper foam; FIG. 2E may show a device 200-*e* with such a configuration of device 200-*d*. Generally, first wicking layer 120-*d* and second wicking layers 120-*f* may include more wires per unit length than vapor layer 120-*e*; for example, first wicking layer 120-*d*-1 and second wicking layer 120-*f*-1 may include a fine mesh layer, while vapor layer 120-*e*-1 may include a coarse mesh layer.

Figure 2F:
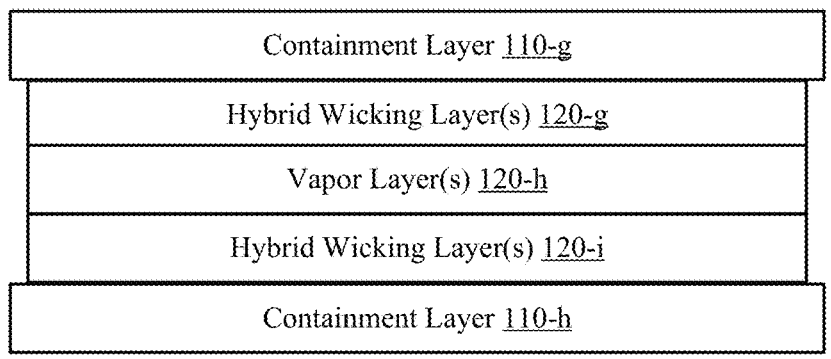
FIG. 2F shows a device in accordance with various embodiments.

Turning now to FIG. 2F, a two-phase thermal management device 200-*f* in accordance with various embodiments is provided. Device 200-*f* may be an example of device 100 of FIG. 1, device 200-*a* of FIG. 2A, device 200-*b* of FIG. 2B, device 200-*c* of FIG. 2C, device 200-*d* of FIG. 2D, and/or device 200-*f* of FIG. 2F. Device 200-*f* may include containment layers 110-*g* and 110-*h*. In addition, device 200-*f* may include hybrid wicking layer(s) 120-*g* and 120-*i* along with vapor layer(s) 120-*h*. Hybrid wicking layer(s) 120-*g* and 120-*i* may in general contain two or more porous layers of different sizes, such as a first porous layer that includes fewer wires per unit length than a second porous layer that makes up the hybrid wicking structure. In general, the vapor layer(s) 120-*h* may include one or more porous layers that have fewer wires per unit length than the porous layers of the hybrid wicking layer(s) 120-*g* and 120-*i*.

Figure 2G:
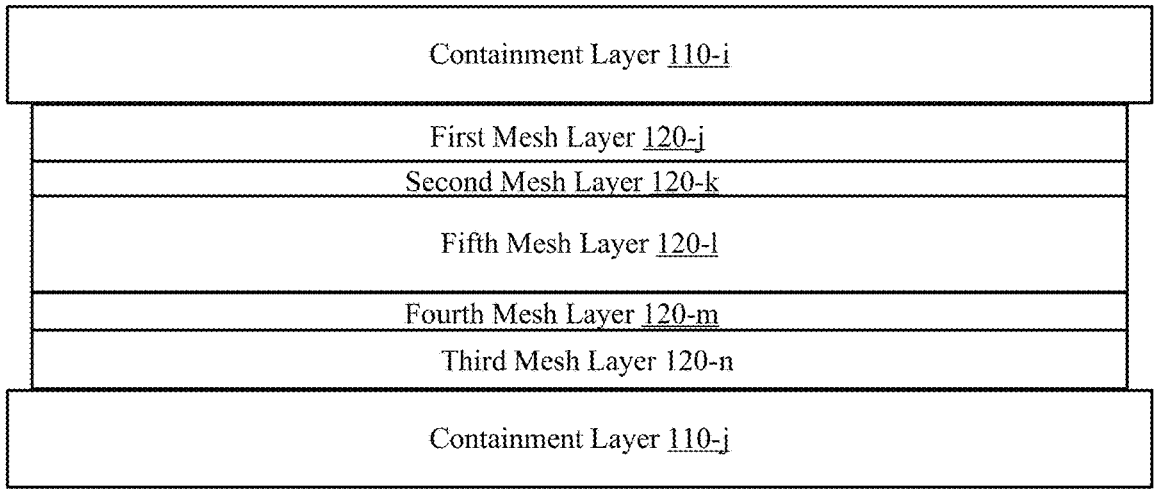
FIG. 2G shows a device in accordance with various embodiments.

For example, FIG. 2G, shows a two-phase thermal management device 200-*g* that may be an example of device 200-*f* of FIG. 2F. Device 200-*g* may include containment layers 110-*i* and 110-*j* along with first mesh layer 120-*j*, second mesh layer 120-*k*, third mesh layer 120-*n*, fourth mesh layer 120-*m*, and fifth mesh layer 120-*l*. First mesh layer 120-*j* and second mesh layer 120-*k* may form a first hybrid wicking structure, while the third mesh layer 120-*n* and the fourth mesh layer 120-*m* may form a second hybrid wicking structure. The fifth mesh layer 120-*k* may provide a vapor layer. In general, the second mesh layer 120-*k* and the fourth mesh layer 120-*m* may have more wires per unit length than the first mesh layer 120-*j* and the third mesh layer 120-*n*. The fifth mesh layer 120-*l* may have fewer wires per unit length than the first mesh layer 120-*j*, the second mesh layer 120-*k*, the third mesh layer 120-*n*, and/or the fourth mesh layer 120-*m*.

Figure 2H:
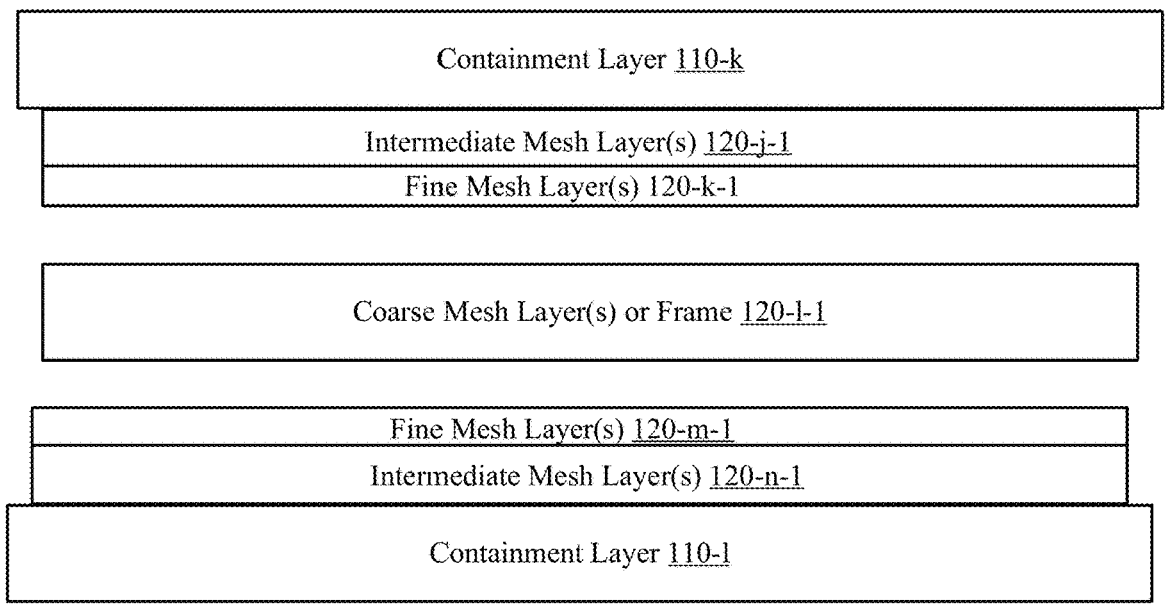
FIG. 2H shows a device in accordance with various embodiments.

FIG. 2H provides an example of a device 200-*h* reflected in several components before final assembly in accordance with various embodiments. Device 200-*h* may be an example of device 200-*f* of FIG. 2F and/or device 200-*g* of FIG. 2G, as reflected in several components before final assembly. Device 200-*h* may have a first component that may include containment layer 110-*k* along with one or more intermediate mesh layers 120-*j*-1 and one or more fine mesh layers 120-*k*-1. These components may be bonded with each other in a stage of construction. In general, the one or more intermediate mesh layers 120-*j*-1 may each have fewer wires per unit length that the one or more fine mesh layers 120-*k*-1. These components when combined may be referred to as a hybrid wicking structure and/or component. Similarly, device 200-*h* may have a second component that may include containment layer 110-*l* along with one or more intermediate mesh layers 120-*n*-1 and one or more fine mesh layers 120-*m*-1. These components may be bonded with each other in a stage of construction. In general, the one or more intermediate mesh layers 120-*n*-1 may each have fewer wires per unit length that the one or more fine mesh layers 120-*m*-1. These components when combined may be referred to as a hybrid wicking structure and/or component. In general, the one or more coarse mesh layers 120-*l*-1 may have fewer wires per unit length than the one or more intermediate mesh layers 120-*j*-1/120-*n*-1 and/or the one or more fine mesh layers 120-*k*-1/120-*m*-1. Device 200-*h* may also include one or more coarse mesh layers and/or a frame 120-*l*-1 as another component. When all three components are bonded together, one may result in a device such as device 200-*g* of FIG. 2G.

Figure 2I:
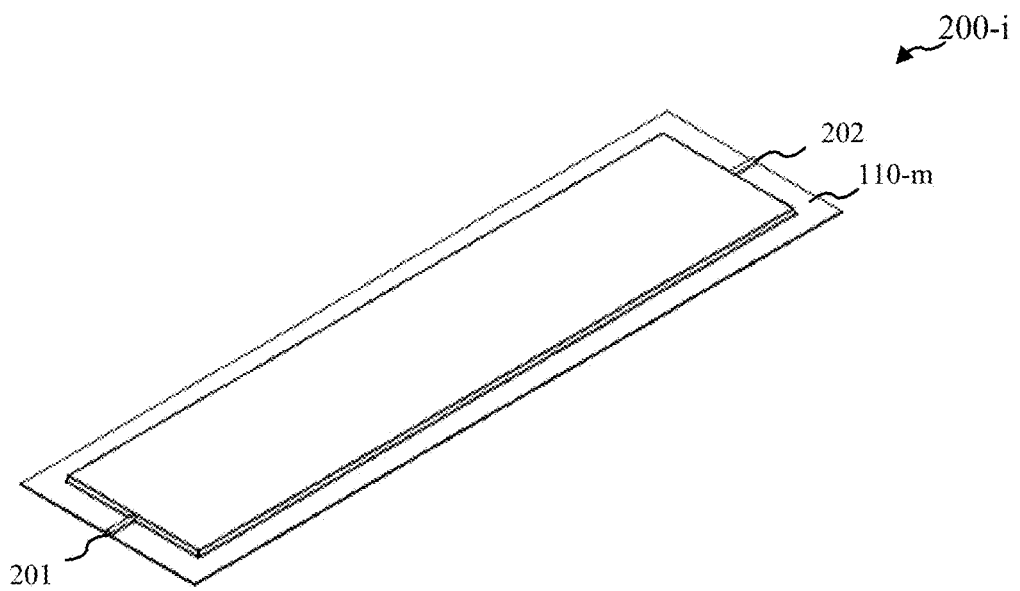
FIG. 2I shows a device in accordance with various embodiments.
Figure 2J:
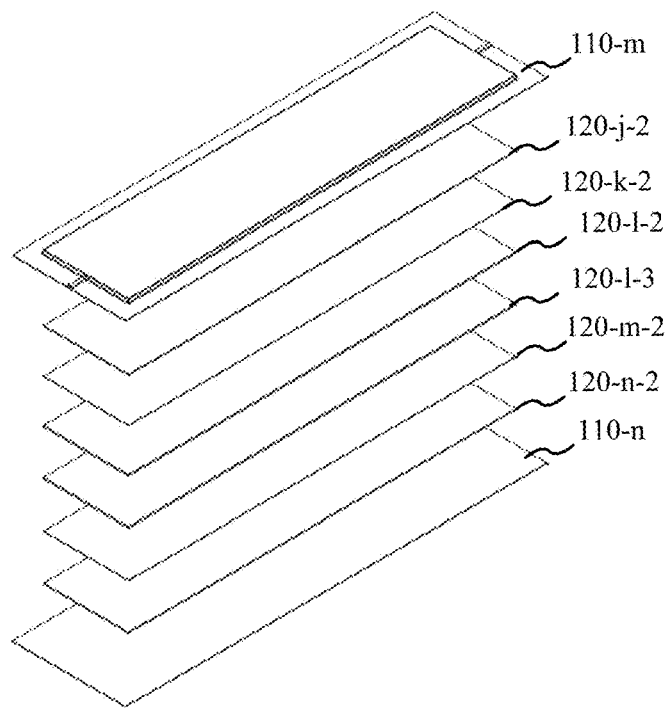
FIG. 2J shows a device in accordance with various embodiments.

Turning now to FIG. 2I and FIG. 2J, a bonded view 200-*i* and an exploded view 200-*j* of a two-phase thermal management device are shown in accordance with various embodiments; these may provide an example of device 100 of FIG. 1, device 200-*f* of FIG. 2F, and/or device 200-*g* of FIG. 2G, for example. In particular, bonded view 200-*i* may highlight a containment layer 110-*m* along with charging tubes 201 and 202 that may be utilized for charging purposes. The exploded view 200-*j* may show containment layer 110-*m* and 110-*n* along with numerous porous layers 120, such as one or more first mesh layer 120-*j*-2, one or more second mesh layers 120-*k*-2, one or more third mesh layers 120-*l*-2/120-*l*-3, one or more forth mesh layers 120-*m*-2, and/or one or more fifth mesh layers 120-*n*-2. In general, the combinations of the one or more first mesh layer 120-*j*-2 and the one or more second mesh layers 120-*k*-2 may form a first hybrid wicking structure and the one or more forth mesh layers 120-*m*-2 and the one or more fifth mesh layers 120-*n*-2 may form a second hybrid wicking structure. The one or more third mesh layers 120-*l*-2/120-*l*-3 may in general form one or more vapor layers.

Figure 3A:
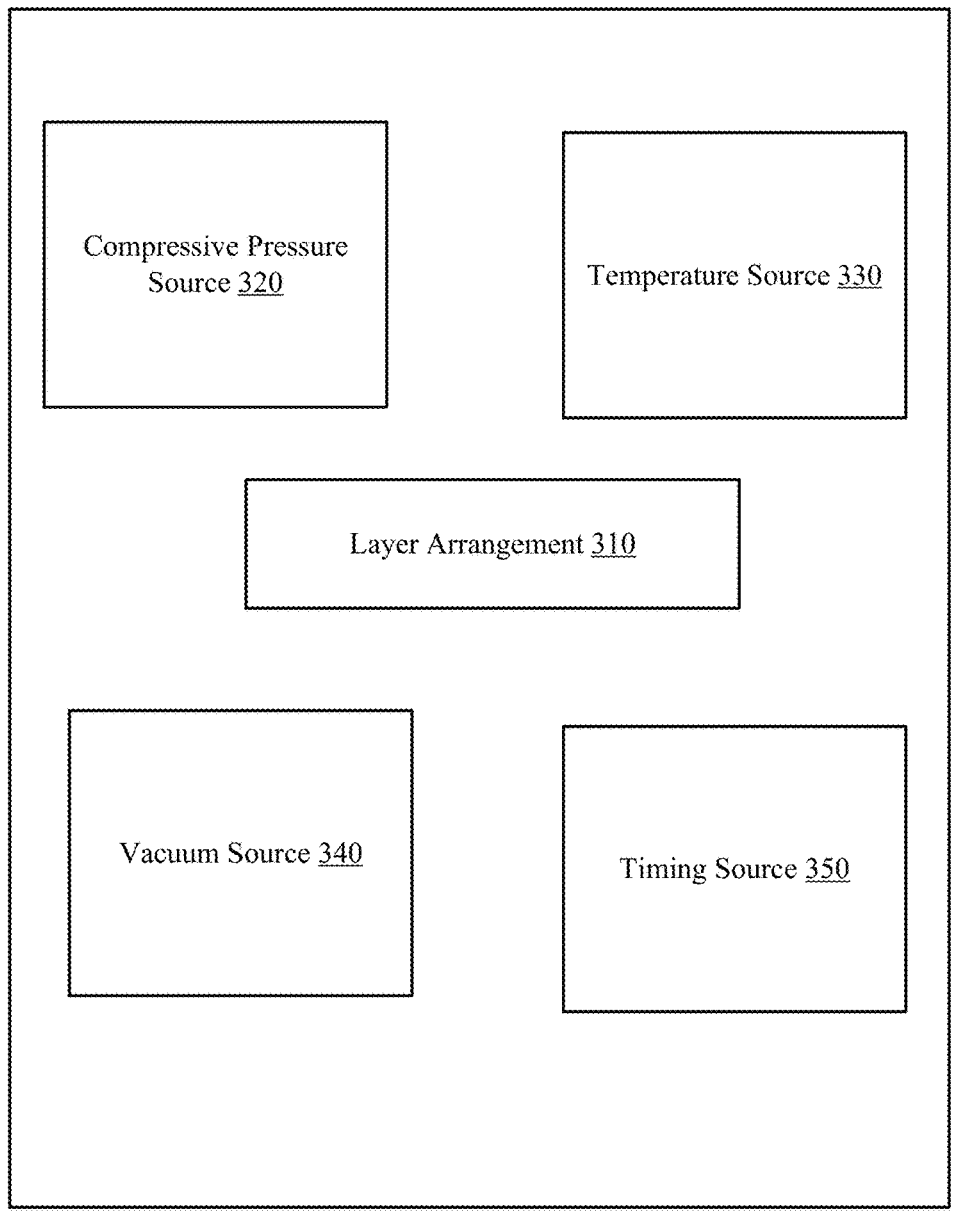
FIG. 3A and FIG. 3B show systems in accordance with various embodiments.

Turning now to FIG. 3A, a system 300-*a* is provided in accordance with various embodiments. System 300-*a* may be utilized to construct such devices as shown in FIG. 1, FIG. 2A, FIG. 2B, FIG. 2C, FIG. 2D, FIG. 2E, FIG. 2F, FIG. 2G, FIG. 2H, FIG. 2I, and/or FIG. 2J, for example.

System 300-*a* may include components that allow for layer arrangement 310 to be set up, such as the layers shown in FIG. 1, FIG. 2A, FIG. 2B, FIG. 2C, FIG. 2D, FIG. 2E, FIG. 2F, FIG. 2G, FIG. 2H, FIG. 2I, and/or FIG. 2J. For example, multiple materials layers including one or more porous layers positioned between at least a portion of two or more containment layers may be arranged within system 300-*a*. System 300-*a* may include a variety of other components that may be separate and/or integrated with each other, such as a compressive pressure source 320, a temperature source 330, a vacuum source 340, and/or a timing source 350. In some embodiments, one or more of these components may be combined with each other.

System 300-*a*, for example, may be utilized to bond multiple material layers, such as containment layers and/or porous layers, with each other utilizing diffusion bonding. System 300-*a* may be utilized to bond the multiple material layers with each other at least simultaneously or in a single manufacturing step.

Temperature source 330 may be utilized with respect to the bonding process to heat the multiple material layers, while the compressive pressure source 320 may apply compressive pressure to the multiple material layers. Heating the multiple material layers with temperature source 330 may include heating the multiple layers to a temperature greater than or equal to 850 degrees Celsius. Heating the multiple material layers with temperature source 330 may include heating the multiple layers to a temperature between 56% and 86% of the melting temperature of the multiple material layers. Some embodiments may include heating the multiple material layers with temperature source 330 may include heating the multiple layers to a temperature between 65% and 75% of the melting temperature of the multiple material layers. Applying compressive pressure to the multiple material layers utilizing the compressive pressure source 320 may include applying a pressure greater than or equal to 1,000 psi. In some embodiments, at least the heating or the compressive pressure applying occurs for 20 minutes or longer, which may be facilitated utilizing timing source 350.

Some embodiments of system 300-*a* may include a vacuum source 340, which may be utilized to evacuate air from the devices fabricated by system 300. The compressive pressure source 320 may be utilized to sealing one or more edges of the two or more containment layers to one another. In some embodiments, the vacuum source 340 may be combined with the temperature source 330 and/or compressive pressure source 320.

Figure 3B:
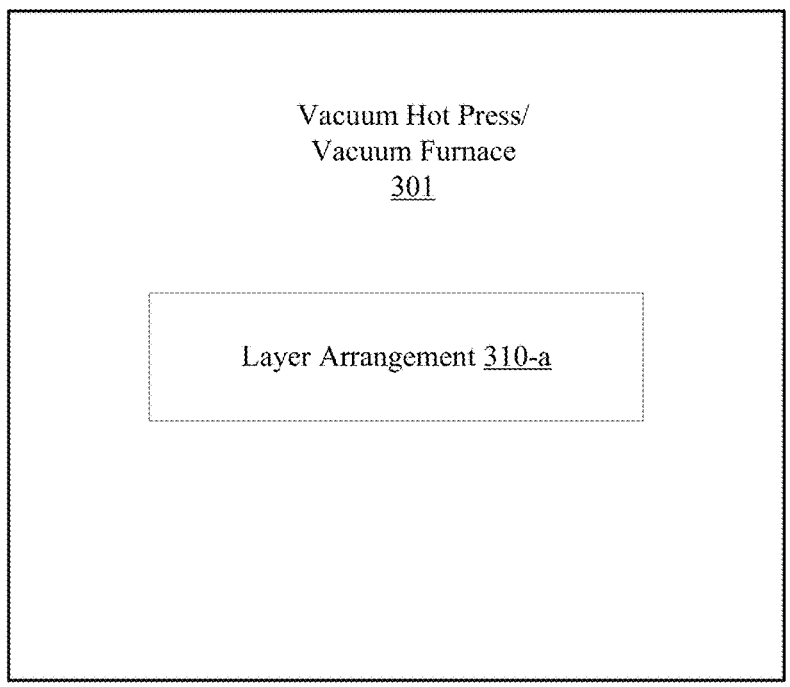

Merely by way of example, system 300-*b* of FIG. 3B is also provided in accordance with various embodiments. System 300-*b* may be utilized to construct such devices as shown in FIG. 1, FIG. 2A, FIG. 2B, FIG. 2C, FIG. 2D, FIG. 2E, FIG. 2F, FIG. 2G, FIG. 2H, FIG. 2I, and/or FIG. 2J. System 300-*b* may be an example of system 300-*a* of FIG. 3A.

System 300-*b* may include components that allow for layer arrangement 310-*a* to be set up, such as the layers shown in FIG. 1, FIG. 2A, FIG. 2B, FIG. 2C, FIG. 2D, FIG. 2E, FIG. 2F, FIG. 2G, FIG. 2H, FIG. 2I, and/or FIG. 2J. For example, multiple materials layers including one or more porous layers positioned between at least a portion of two or more containment layers may be arranged within system 300-*b*. System 300-*b* may include a vacuum hot press and/or vacuum furnace 301 that may be utilized to bond the multiple material layers with each other. Vacuum hot press and/or vacuum furnace may a variety of other components that may be separate and/or integrated with each other to provide a variety of functions, such as those shown in FIG. 3A (e.g., a compressive pressure source 320, a temperature source 330, a vacuum source 340, and/or a timing source 350).

Figure 3C:
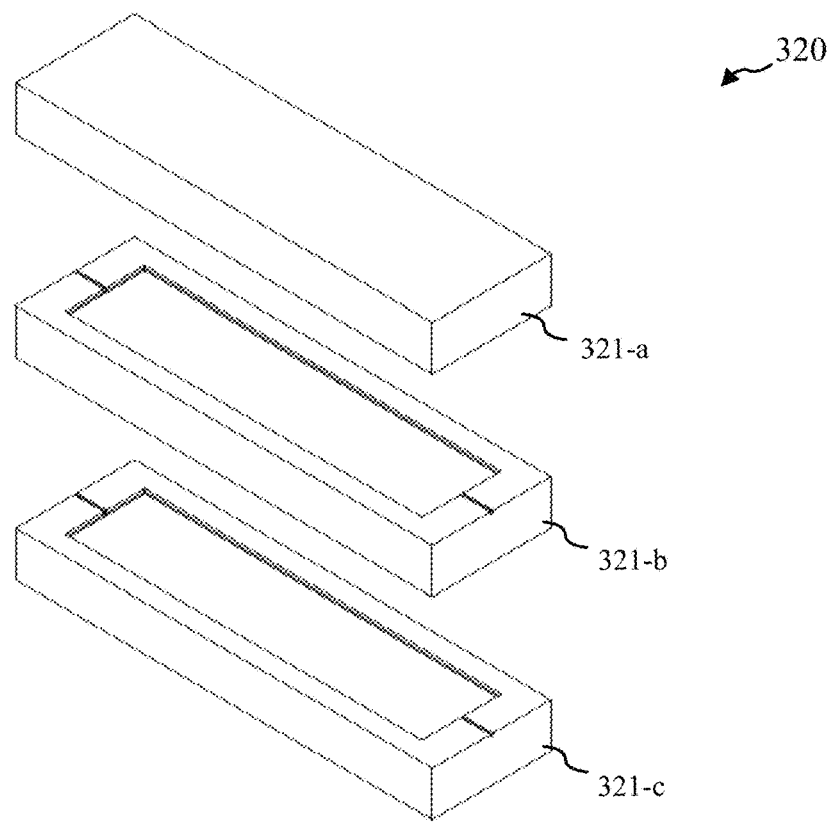
FIG. 3C and FIG. 3D show systems in accordance with various embodiments.

Turning now to FIG. 3C, a system 320 is provided in accordance with various embodiments. System 320 may be utilized to construct such devices as shown in FIG. 1, FIG. 2A, FIG. 2B, FIG. 2C, FIG. 2D, FIG. 2E, FIG. 2F, FIG. 2G, FIG. 2H, FIG. 2I, and/or FIG. 2J, for example. System 320 may include fixturing components 321-*a*, 321-*b*, and/or 321-*b* that may be utilized for layer arrangement to be set up, such as the layers shown in FIG. 1, FIG. 2A, FIG. 2B, FIG. 2C, FIG. 2D, FIG. 2E, FIG. 2F, FIG. 2G, FIG. 2H, FIG. 2I, and/or FIG. 2J. System 320 may be utilized in conjunction with other systems such as system 300-*a* of FIG. 3A and/or system 300-*b* of FIG. 3B. For example, multiple materials layers including one or more porous layers positioned between at least a portion of two or more containment layers may be arranged within system 320. The fixturing components 321-*a*, 321-*b*, and/or 321-*c* may include portions sized to conform to the size of different two-phase thermal management devices. System 320 in particular may be configured for fabricating two or more thermal management devices at the same time. In some embodiments, the fixturing components 321-*a*, 321-*b*, and/or 321-*c* may be fabricated from graphite.

System 320 may be utilized to bond multiple material layers, such as containment layers and/or porous layers, with each other utilizing diffusion bonding. System 320 may be utilized to bond the multiple material layers with each other at least simultaneously or in a single manufacturing step.

Figure 3D:
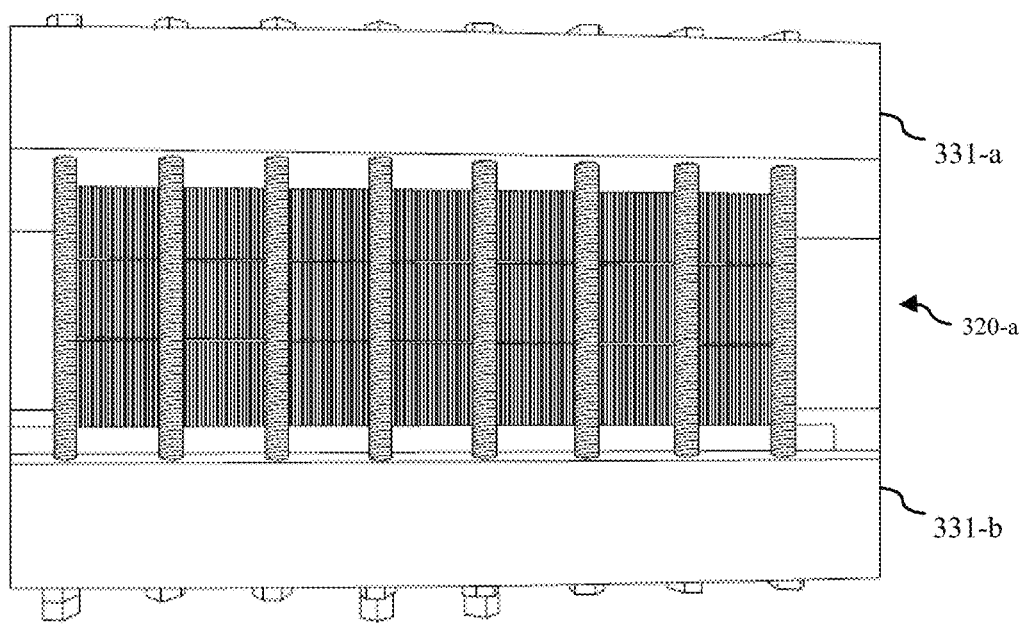

FIG. 3D shows a photo of a system 330 in accordance with various embodiments that may include system 320-*a*, which may be an example of system 320 of FIG. 3C. In this example, system 320 may be pressed between plates 331-*a* and 331-*b* as part of the bonding process to fabricate one or more two-phase thermal management devices. In some embodiments, a vacuum furnace may be utilized in conjunction with the fixturing components.

The devices and/or systems as shown in FIG. 1, FIG. 2A, FIG. 2B, FIG. 2C, FIG. 2D, FIG. 2E, FIG. 2F, FIG. 2G, FIG. 2H, FIG. 2I, FIG. 2J, FIG. 3A, FIG. 3B, FIG. 3C, and/or FIG. 3D may be utilized to fill in gaps in advanced heat management components for satellites, for example. These devices and/or systems may provide space-rated two-phase thermal management devices or systems (e.g., two-phase thermal straps, two-phase thermal spreaders, and/or two-phase thermal energy storage devices) that may operate efficiently in vacuum and may integrate easily into satellite electronic chassis designs. Merely by way of example, some embodiments may integrate with CubeSats and SmallSats. Some of these devices and/or systems may include flat flexible heat pipe capable of spaceflight and enabled by scalable and cost-effective diffusion bonding manufacturing process. Some embodiments may include flat, rigid heat spreaders and/or conformal thermal energy storage devices.

The different devices, methods, and systems provided may help reduce the number of on-orbit failures of different satellites, which may be due to inadequate thermal design and/or attention to the thermal limitations of different electronics (commercial-off-the-shelf (COTS) in particular) that may contribute to reduce operational lifetimes. While some embodiment may be applicable for space applications, some embodiments may be applicable to consumer electronics and various other commercial applications. Some embodiment may reduce acquisition cost of future thermal management systems and may ensure a robust supply chain.

Some embodiments of the various devices and/or system provided in may be configured to withstand the internal vapor pressure of the working fluid when operating in the space vacuum environment. In some embodiments, diffusion bonding may be utilized as a manufacturing technique for different devices and/or systems in accordance with various embodiments.

Figure 4A:
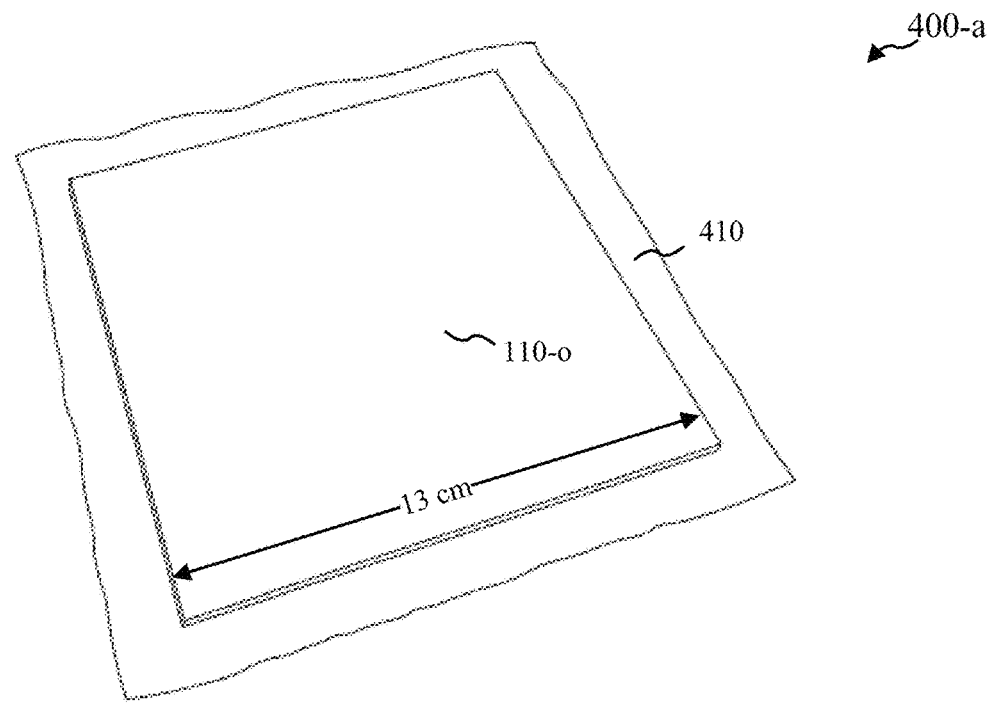
FIG. 4A and FIG. 4B show a device in accordance with various embodiments.
Figure 4B:
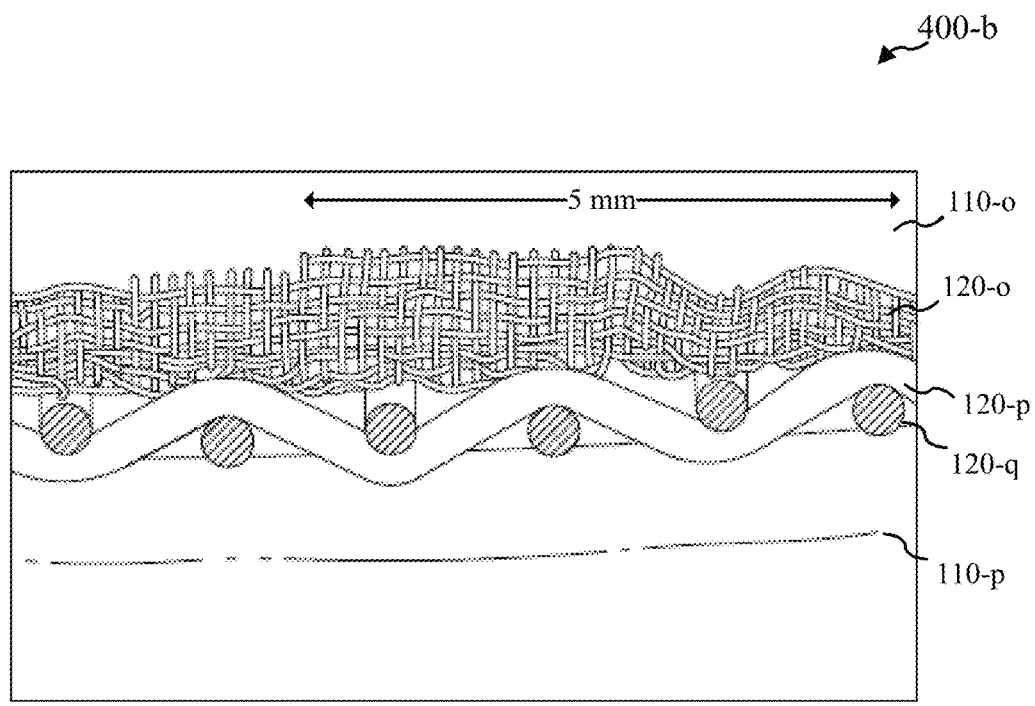

FIG. 4A shows an example of a photograph of a device 400-*a* constructed utilizing diffusion bonding in accordance with various embodiments. Device 400-*a* may be an example of device 100 of FIG. 1, for example. Device 400-*a* shows at least one of the containment layers 110-*o*. In addition, device 400-*a* may show that the outer portion of containment layer 110-*o* may be sealed 410 with another containment layer (not shown). FIG. 4B shows a cross section 400-*b* of device 400-*a* shown in FIG. 4A. While device 400-*a* shows a linear dimension of 13 cm, other embodiments may include shorter or longer linear dimensions. Similarly, FIG. 4B shows the scale of 5 mm, while other embodiments may include other sizes. The cross section 400-*b* may show containment layers 110-*o* and 110-*p* along with first wicking layer 120-*o* (shown as fine mesh), a vapor layer 120-*p* (shown as a coarse mesh), and/or a second wicking layer 120-*q* (shown as a fine mesh). Device 400-*a* and/or device 400-*b* may utilize aspects of those systems and/or devices shown in FIG. 1, FIG. 2A, FIG. 2B, FIG. 2C, FIG. 2D, FIG. 2E, FIG. 2F, FIG. 2G, FIG. 2H, FIG. 2I, FIG. 2J, FIG. 3A, and/or FIG. 3B.

In some embodiment, such as those shown in FIG. 4A and/or FIG. 4B for example, the diffusion-bonded parts may be capable of carrying over 100 psi of internal pressure; some embodiments may be capable of carrying over 135 psi. This may exceed the design internal operating pressure of these embodiments. These embodiments may perform three times better with 48% less weight than a solid copper heat sink at a fraction of the weight and volume, for example.

Some embodiments of the systems, devices, and/or methods provided may address a variety of cooling challenges with respect to electronic components, including those that may be utilized on satellites. For example, some embodiment may help eliminate derating that may occur for some electronic components, such as some current generation COTS processors, and may enable the use of higher-power, next-generation electronic components through the use of compact, conformable, lightweight devices and systems that may be capable of moving 10's of watts/in$^2$ of waste heat or more from the electronic components, such as electronic boards, to a chassis, such as a satellite chassis.

One may note that some other systems or devices that may be utilized for thermal management may include thermal straps, which may utilize conduction cooling through a series of metal foils or braided cables between two end fittings, and/or heat pipes. A thermal strap may allow for mechanical decoupling between the heat source and sink ends, which typically may not be the case with a heat pipe. Additionally, the simple design of thermal straps may allow for direct integration with a wide variety of component interfaces. Thermal straps, however, may ultimately be limited by the thermal conductivity of the material selected, and the use of "rigid" materials may limit their effectiveness in small, tightly packaged enclosures, like the interior of small satellites. A heat pipe may generally operate with extremely high apparent thermal conductivity, as compared with thermal straps, by utilizing a phase change of a cooling fluid at the heat source (evaporator) and transporting heat via vapor transport to the heat sink (condenser). Fluid circulation may be achieved passively through a wicking layer on the inside wall of the heat pipe cavity. A fluid may be selected for a given environmental and operational conditions. For example, ammonia may be used as the working fluid in space-based heat pipes due to its favorable thermophysical properties over the relevant temperature range of 200K to 350K. While "micro heat pipes" have been built, in order to hold the internal operating pressures, these devices may be rigid making them difficult to easily conform within the crowded internal space of a small satellite. Some embodiments of the systems, devices, and/or methods provided may address one or more of the problems with thermal straps and/or heat pipes.

Some embodiment may facilitate lower manufacturing cost and lead time as well as scale the size and quantity of different systems or devices provided. For example, different manufacturing techniques in accordance with various embodiments that may involve transitioning the manufacturing of hybrid wicking structures from processes that may be familiar to the microelectronics industry, such as photolithography and chemical etching of microchannels, to industrial process such as roll forming, stamping, and diffusion bonding. For example, utilizing roll manufactured copper hybrid wicks, it may be shown that fluid may wicks extremely quickly over the entire surface of wicks dipped vertically in an acetone working fluid and with equal effectiveness compared to chemically etched hybrid wicks. Manufacturing techniques may be utilized with respect to aspects systems and/or devices shown in FIG. 1, FIG. 2A, FIG. 2B, FIG. 2C, FIG. 2D, FIG. 2E, FIG. 2F, FIG. 2G, FIG. 2H, FIG. 2I, FIG. 2J, FIG. 3A, FIG. 3B, FIG. 4A, FIG. 4B, FIG. 6, FIG. 7A, FIG. 7B, FIG. 8A, FIG. 8B, FIG. 8C, FIG. 8D, FIG. 8E, FIG. 8F, FIG. 9A, FIG. 9B, FIG. 10A, FIG. 10B, and/or FIG. 10C.

Figure 5A:
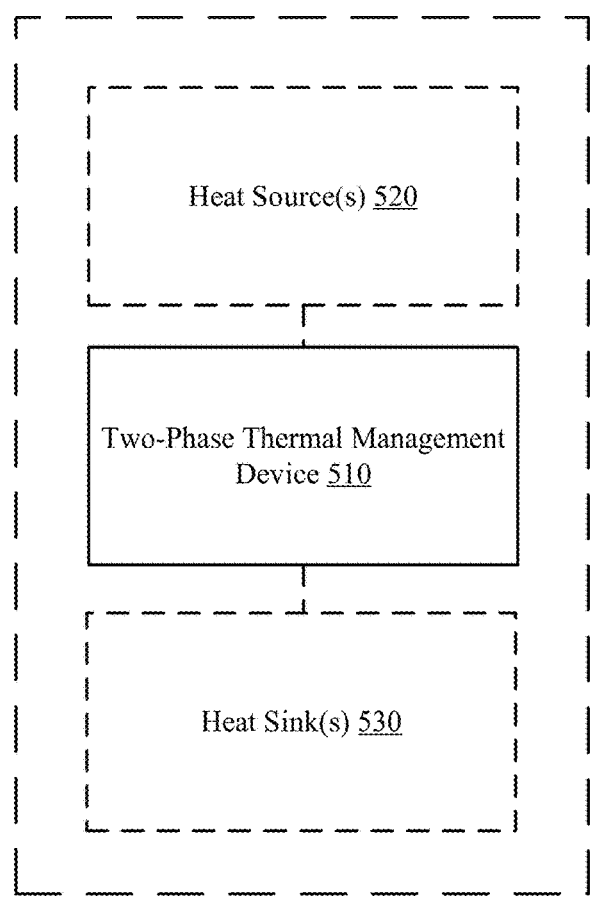
FIG. 5A, FIG. 5B, FIG. 5C, and FIG. 5D show systems in accordance with various embodiments.

Turning now to FIG. 5A, a system 500-$a$ in accordance with various embodiments is provided. System 500-$a$ may include one or more two-phase thermal management devices 510, which may be an example of the two-phases thermal management devices of FIG. 1, FIG. 2A, FIG. 2B, FIG. 2C, FIG. 2D, FIG. 2E, FIG. 2F, FIG. 2G, FIG. 2H, FIG. 2I, FIG. 2J, FIG. 4A, FIG. 4B, FIG. 6, FIG. 7A, FIG. 7B, FIG. 8A, FIG. 8B, FIG. 8C, FIG. 8D, FIG. 8E, FIG. 8F, FIG. 9A, FIG. 9B, FIG. 10A, FIG. 10B, and/or FIG. 10C.

System 500-$a$ may also include one or more heat sources 520 and one or more heat sinks 530. The one or more heat sources 520 and/or one or more heat sinks may be thermally coupled with the one or more two-phase thermal management devices 510. In general, heat from the one or more heat sources 520 may be collected by the one or more two-phase thermal management devices 510 at one or more evaporator regions of the one or more two-phase thermal management devices 510 and rejected to the heat sink 530 at one or more condenser regions of the one or more two-phase thermal management devices 520.

Figure 5B:
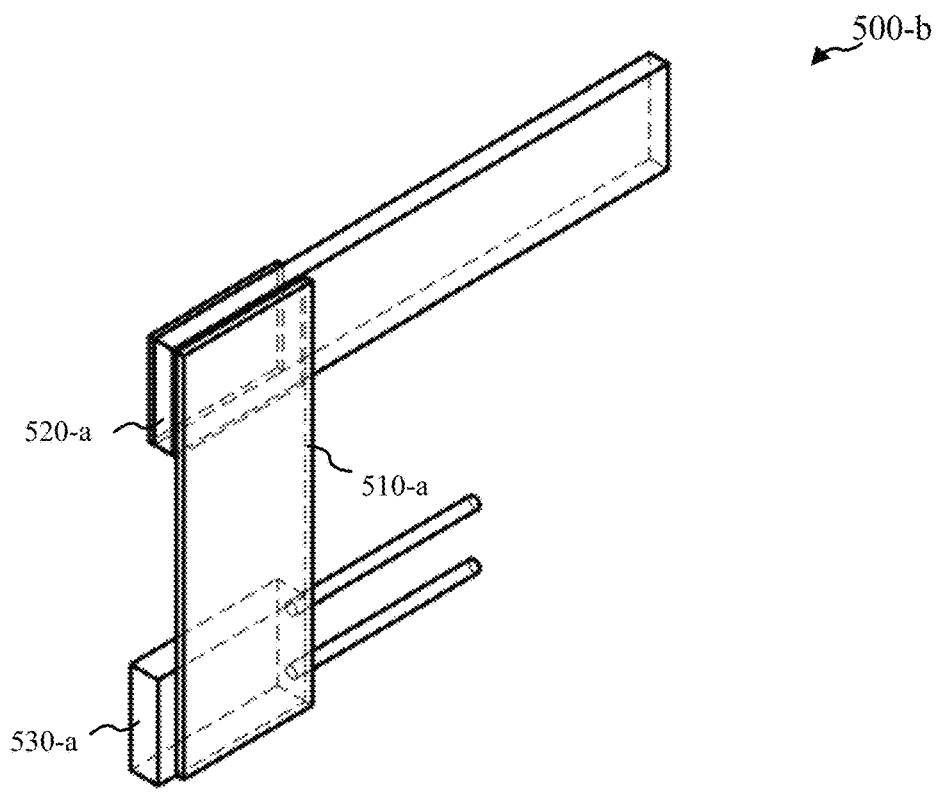
Figure 5C:
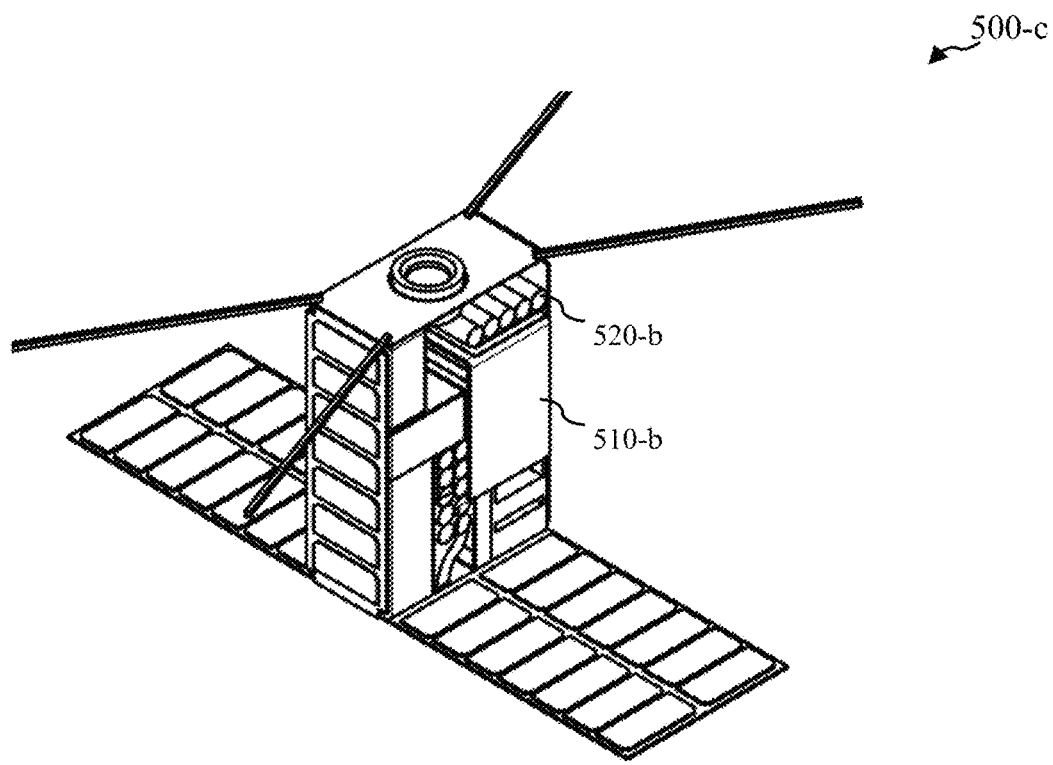
Figure 5D:
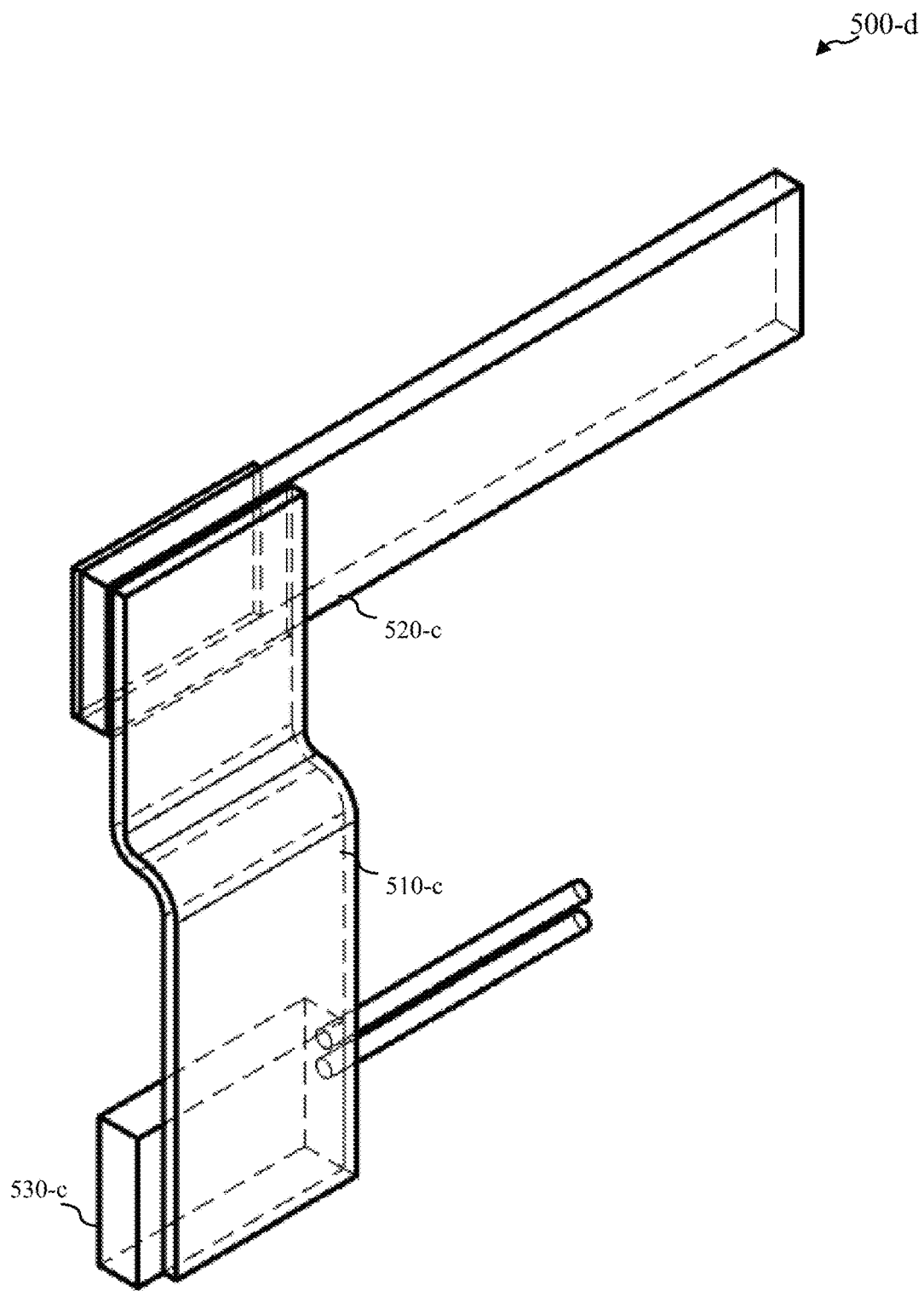

FIG. 5B, FIG. 5C, and FIG. 5D show examples of system 500-$b$, 500-$c$, and 500-$d$, respectively, in accordance with various embodiments. Systems 500-$b$, 500-$c$, and/or 500-$d$ may be examples of system 500-$a$ of FIG. 5A. System 500-$b$, for example, may include a two-phase thermal management device 510-$a$ that may be coupled with a heat source 520-$a$ and a heat sink 530-$a$. System 500-$c$ may provide another example of a two-phase thermal management device 510-$b$ that may be coupled with one or more satellite components as heat sources 520-$b$. While these two-phase thermal management devices 510 are show in generally flat configurations, some configurations may be constructed from flexible materials such that the devices 510 may be shaped to conform to different configurations. For example, system 500-$d$ may include a two-phase thermal management device 510-$c$ that may be coupled with a heat source 520-$c$ and a heat sink 530-$c$; two-phase-thermal management device 510-$c$ may be fabricated from flexible materials such that the device 510-$c$ may be shaped to conform to different configurations. These examples may be utilized to transport heat away from different components and/or to spread heat from one or more components. In some embodiments, an ambient environment may be utilized as a heat sink.

Figure 6:
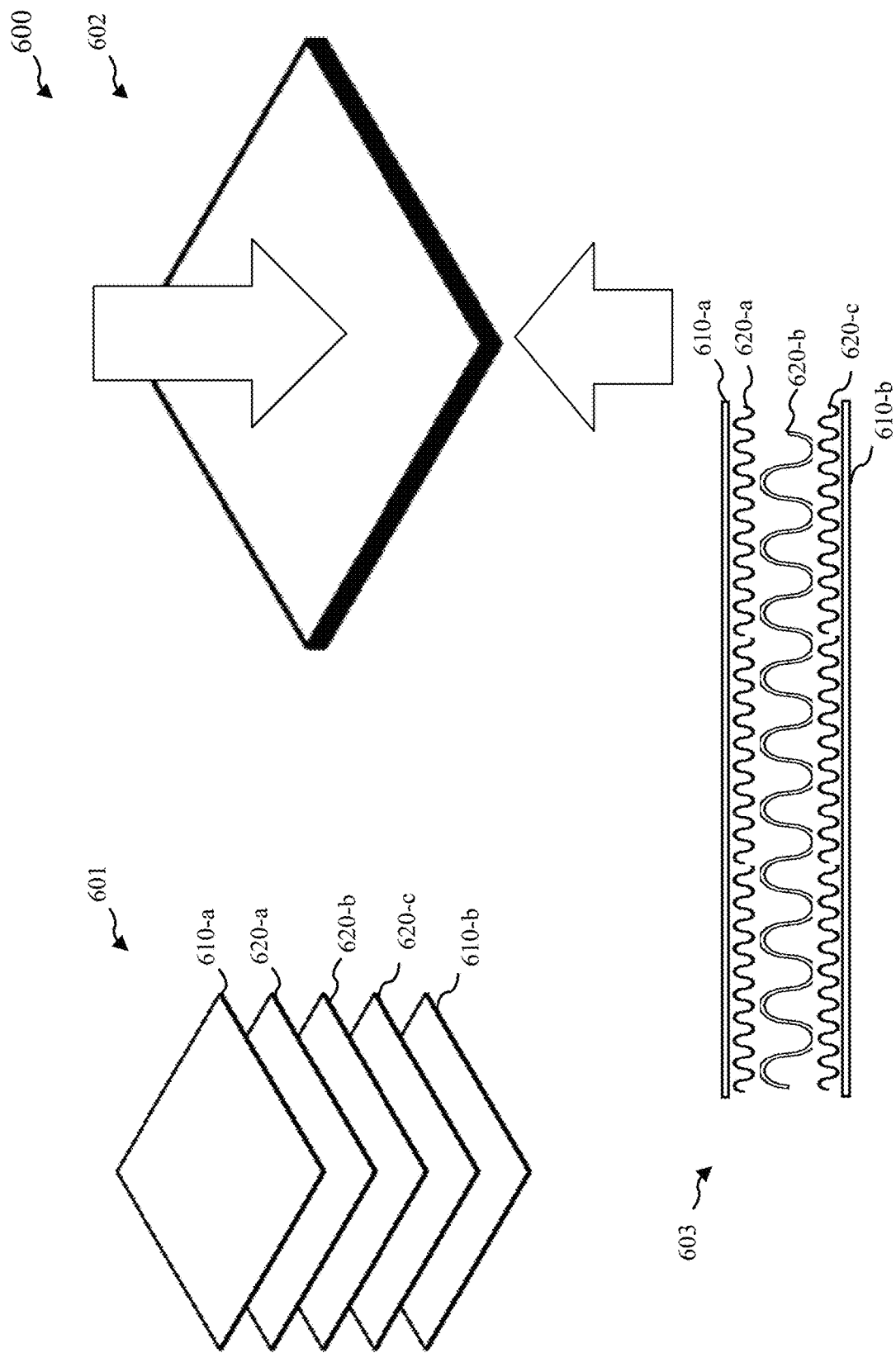
FIG. 6 show different views of a device in accordance with various embodiments.

One may note that in general efforts to date may have been focused on devices that work under atmospheric pressure. Some embodiments may include designs with a flexible casing in tandem with an architecture and manufacturing method that contains internal vapor pressures that may be involved for operation in vacuum. For example, some embodiments may include space-rated two-phase thermal straps that may operate efficiently in vacuum and may integrate easily into different satellite designs, such as Cube- Sat electronic chassis designs, merely by way of example. Some embodiments many include a core and outer casing design that may remain flexible while maintaining the working fluid at its vapor pressure in vacuum without significant physical expansion or structural failure. For example, FIG. 6 shows a system 600 in accordance with various embodiments. System 600 may include manufacturing methods that may bond different layers together, creating a three-dimensional structure capable of carrying internal vapor pressure through the thermal strap thickness. System 600 may utilize aspects of those systems and/or devices shown in FIG. 1, FIG. 2A, FIG. 2B, FIG. 2C, FIG. 2D, FIG. 2E, FIG. 2F, FIG. 2G, FIG. 2H, FIG. 2I, FIG. 2J, FIG. 4A, FIG. 4B, FIG. 5A, FIG. 5B, FIG. 5C, FIG. 5D, FIG. 7A, FIG. 7B, FIG. 8A, FIG. 8B, FIG. 8C, FIG. 8D, FIG. 8E, FIG. 8F, FIG. 9A, FIG. 9B, FIG. 10A, FIG. 10B, and/or FIG. 10C. In particular, system 600 shows an exploded view 601 of a two-phase thermal management device, a bonded view 602 of the two-phase thermal management device, and a cross-section view 603 of the two-phase thermal management device in accordance with various embodiments. Exploded view 601 and cross-section view 603 show two containment layers 610-$a$/610-$b$ along with three internal porous layers 620-$a$/620-$b$/620-$c$. Each of the porous layers 620 may include one or more porous layers. In some embodiments, the containment layers 610-$a$/610-$b$ may include a metal foil, such as a copper foil. The porous layers 620-$a$/620-$b$/620-$c$ may include one or more mesh and/or metal foam layers. Layers 620-$a$/620-$c$, in general may form one or more wicking layers, while layer 620-$b$ may form a vapor layer or vapor core. In general, layer(s) 620-$b$ may include fewer wires per unit area than layers 620-$a$/620-$c$. The bonded view 602 may result from thermocompression or diffusion bonding of the layers from exploded view 601. The cross-section view 603 may provide a 3-D web structure of wicking and vapor regions that may carry vapor pressure while allowing for flexibility through shear compliance.

To contrast, other terrestrial flat flexible heat pipes may generally contain a negative internal gauge pressure, e.g., the vapor pressure of the working fluid, such that atmospheric pressure may serve to consolidate the flat envelope-like structure and may prevent "ballooning" and loss of pressure seal. However, if atmospheric pressure were to be removed or the internal pressure to increase above the atmospheric pressure, the internal volume of the thermal strap may generally expand or "balloon" due to the working fluid vapor pressure and as a result the internal layers may not be properly constrained for operation. Furthermore, the risk of bursting due to seal failure may be magnified. Some embodiments provided may carry through-thickness tension and thus may sustain an internal vapor pressure in the vacuum of space.

A variety of different working fluids may be utilized in different embodiments. In some cases, the working fluid may have a high figure of merit (i.e., the product of liquid density, surface tension, and latent heat of vaporization, divided by the liquid dynamic viscosity) and low vapor pressure. Water, for example, may offer the highest liquid figure of merit and lowest vapor pressure over the temperature range of interest (0-100° C.). Water with copper casing may be an appropriate combination in some embodiments. Ammonia may be be used with an aluminum cased components in some cases, if adequate pressures may be achieved. Other working fluids may include methanol, acetone, and/or ethyl alcohol. In some cases, cryogenic liquids and/or liquid metals may be utilized in some cases.

One may note that while traditionally, a water-based heat pipe for space applications may raise a failure risk due to possible freeze/thaw cycles leading to heat pipe rupture, typical copper-water heat pipes may actually withstand greater than 50 freeze thaw cycles prior to rupture, which may be beyond the mission lifetime of devices, such as most CubeSats. Additionally, the thin nature of the layers in some embodiments may reduce casing layer stresses when subjected to freeze/thaw cycles.

Figure 7A:
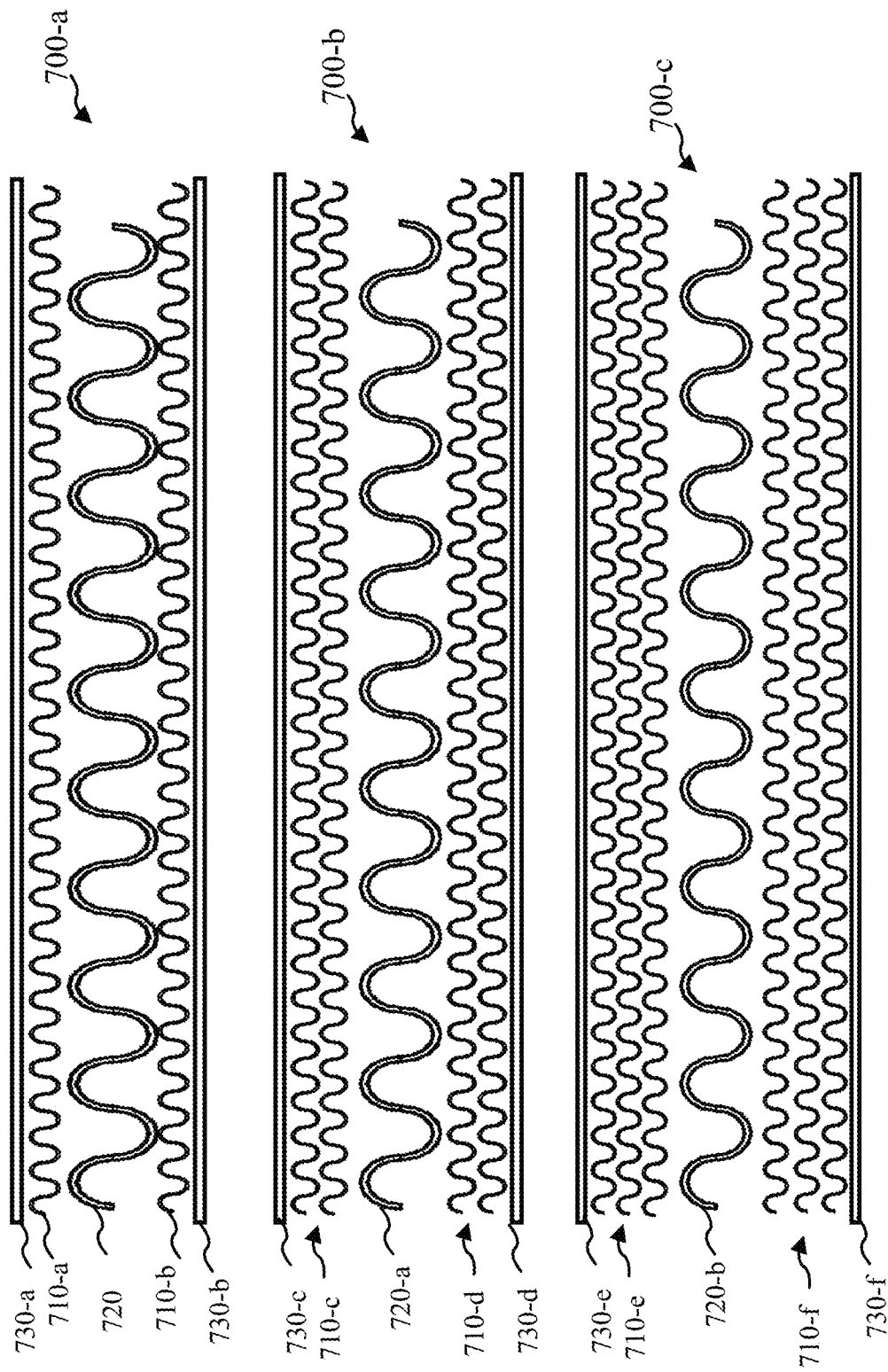
FIG. 7A and FIG. 7B show devices in accordance with various embodiments.

Embodiments may include a variety of lengths and configurations. In general, a maximum heat load that may be dissipated may decrease with increasing length, as viscous losses may increase with the length-path that the vapor and liquid need to travel. For example, FIG. 7A shows three different configurations 700-a, 700-b, and 700-c of two-phase thermal management devices in accordance with various embodiments. Configurations 700-a, 700-b, and/or 700-c may be examples of aspects of devices and/or systems of FIG. 1, FIG. 2A, FIG. 2B, FIG. 2C, FIG. 2D, FIG. 2E, FIG. 2F, FIG. 2G, FIG. 2H, FIG. 2I, FIG. 2J, FIG. 4A, FIG. 4B, FIG. 5A, FIG. 5B, FIG. 5C, FIG. 5D, FIG. 6, FIG. 8A, FIG. 8B, FIG. 8C, FIG. 8D, FIG. 8E, FIG. 8F, FIG. 9A, FIG. 9B, FIG. 10A, FIG. 10B, and/or FIG. 10C.

Configuration 700-a may reflect single wick layer(s) 710-a/710-b positioned between a vapor layer 720 and respective containment layers 730-a/730-b. In some embodiments, single wick layers 710-a/710-b may form a continuous wick layer around vapor layer 720. In some embodiments, single wick layers 710-a/710-b may include more wires per unit length than vapor layer 720. Merely by way of example, single wick layers 710-a/710-b may utilize mesh-200 copper woven screen, while vapor layer 720 may utilize mesh-22 copper woven screen, though other mesh sizes may be utilized).

Configuration 700-b may reflect double wick layer(s) 710-c/710-d positioned between a vapor layer 720-a and respective containment layers 730-c/730-d. In some embodiments, double wick layers 710-c/710-d may form continuous wick layers around vapor layer 720-a. In some embodiments, double wick layers 710-c/710-d may include more wires per unit length than vapor layer 720-a. Merely by way of example, double wick layers 710-c/710-d may utilize mesh-200 copper woven screen, while vapor layer 720-a may utilize mesh-22 copper woven screen, though other mesh sizes may be utilized). In some embodiments, doubling the number of wick layers may increase a maximum heat load for the configuration 700-b compared to configuration 700-a.

Configuration 700-c may reflect triple wick layer(s) 710-e/710-f positioned between a vapor layer 720-b and respective containment layers 730-e/730-f. In some embodiments, triple wick layers 710-e/710-f may form continuous wick layers around vapor layer 720-b. In some embodiments, triple wick layers 710-e/710-f may include more wires per unit length than vapor layer 720-b. Merely by way of example, triple wick layers 710-e/710-f may utilize mesh-200 copper woven screen, while vapor layer 720-b may utilize mesh-22 copper woven screen, though other mesh sizes may be utilized. In some embodiments, tripling the number of wick layers may increase a maximum heat load for the configuration 700-c compared to configuration 700-a.

For these configurations, an off-the-shelf copper mesh may be utilized, with a water-copper contact angle of 68°; other materials and configurations may be utilized. It may be possible to increase the heat load dissipated by different systems and/or devices in accordance with various embodiments through surface treatments of the wicks. Some embodiments, for example, may utilize ultra-omniphilic surface treatment of copper, or so-called "paper towel copper."

Figure 7B:
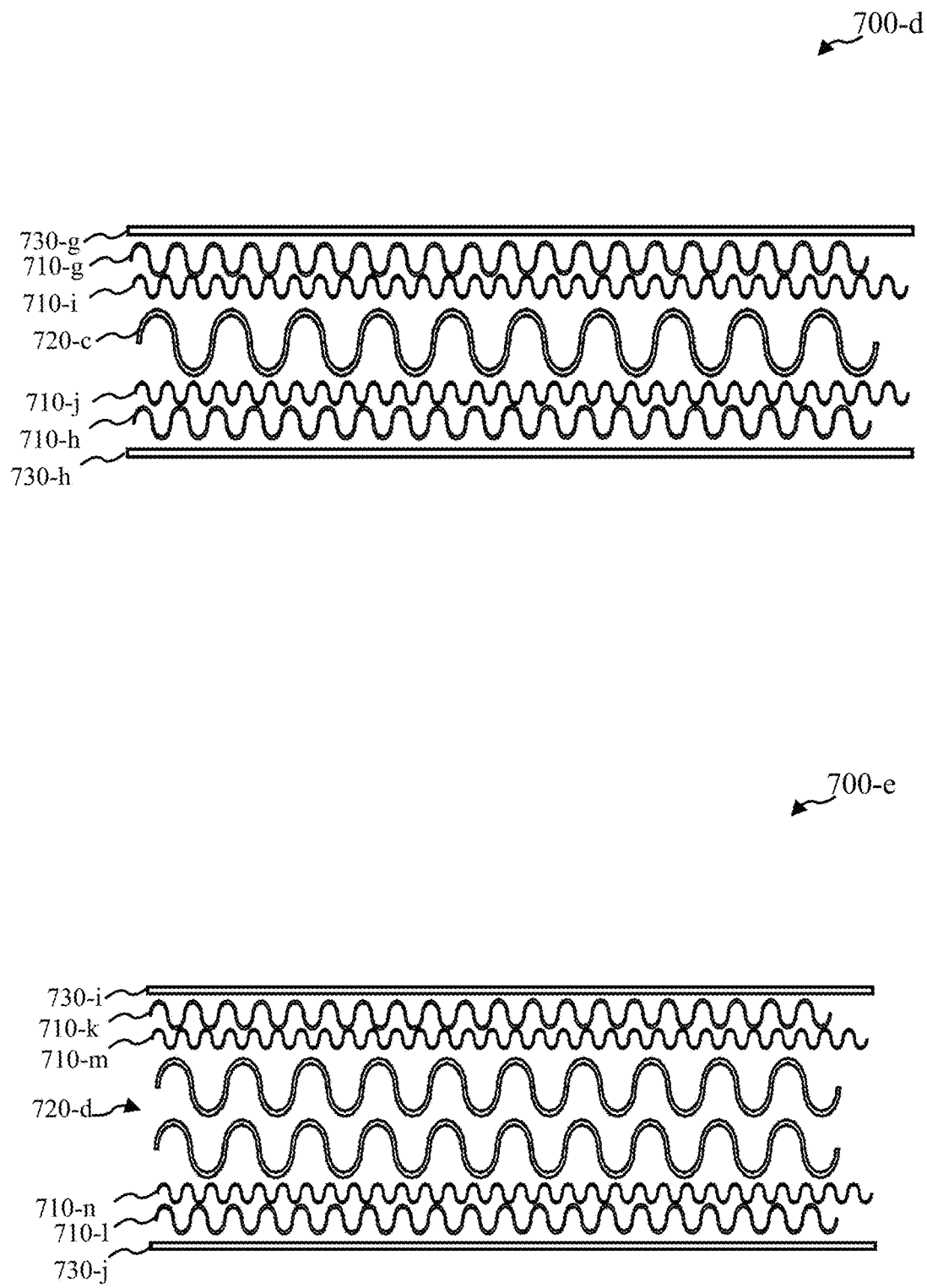

Turning now to FIG. 7B, two configurations 700-d and 700-e of two-phase thermal management devices in accordance with various embodiments are provided. Configurations 700-d and/or 700-e may be examples of aspects of devices and/or systems of FIG. 1, FIG. 2A, FIG. 2B, FIG. 2C, FIG. 2D, FIG. 2E, FIG. 2F, FIG. 2G, FIG. 2H, FIG. 2I, FIG. 2J, FIG. 4A, FIG. 4B, FIG. 5A, FIG. 5B, FIG. 5C, FIG. 5D, FIG. 6, FIG. 8A, FIG. 8B, FIG. 8C, FIG. 8D, FIG. 8E, FIG. 8F, FIG. 9A, FIG. 9B, FIG. 10A, FIG. 10B, and/or FIG. 10C. These configurations may include hybrid wicking structures that may include different sized wick layers. These configurations may also include one or more central vapor layers 720-c/720-d. For example, configuration 700-d may include containment layer 730-g/730-h along with first wicking layers 710-g/710-h and second wicking layers 710-i/720-j. In general, first wicking layers 710-g/710-h may have fewer wires per unit length than second wicking layers 710-i/710-j, but more wires per unit length than vapor layer 720-c. Merely by way of example, first wicking layers 710-g/710-h may utilize mesh-40 copper woven screen, second wicking layers 710-i/710-j may utilize mesh-200 copper woven screen, and/or vapor layer 720-c may utilize mesh-10 copper woven screen. In another embodiment, first wicking layers 710-g/710-h may utilize mesh-100 copper woven screen, second wicking layers 710-i/710-j may utilize mesh-200 copper woven screen, and/or vapor layer 720-c may utilize mesh-10 copper woven screen. Merely by way example, configuration 700-d may be approximately 2 mm thick. Other porous layer sizes and overall widths may be utilized.

Configuration 700-e may include containment layer 730i/730-j along with first wicking layers 710-k/710-l and second wicking layers 710-m/720-n. In this configuration, there may be two layers to vapor layer 720-d. In general, first wicking layers 710-k/710-l may have fewer wires per unit length than second wicking layers 710-m/710-n, but more wires per unit length than vapor layers 720-d. Merely by way of example, first wicking layers 710-k/710-l may utilize mesh-40 copper woven screen, second wicking layers 710-m/710-n may utilize mesh-200 copper woven screen, and/or vapor layers 720-d may utilize mesh-10 copper woven screen. Merely by way example, configuration 700-e may be approximately 4 mm thick. Other porous layer sizes and overall widths may be utilized.

As noted above, some embodiments may include systems, methods, and/or devices for use in space, or other applications, that may involve the ability to carry the internal vapor pressure of the working fluid. The use of thermocompression bonding (also known as diffusion bonding) may be utilized to join different material layers together to help facilitate the ability to carry internal vapor pressure; for example, diffusion bonding may be utilized to join the wick and case layers together in some embodiments. Thermocompression bonding may have several favorable factors, including, but not limited to: may be ideal for flat, thin, COTS materials; may have high integrity interfacial bonds with strengths similar to welding; may include bonding of similar materials without the introduction of dissimilar materials; may make highly hermetic bonds achievable; and/or may be a scalable method for commercial manufacturing of two-phase heat straps.

Similar to sintering of powders, thermocompression bonding generally creates a diffusion bond between surfaces through the application of pressure and/or heat. Merely by way of example, a variety of pressures, temperatures, and durations may be utilized to achieve complete diffusion bonds with this method. For example, a temperature greater than or equal to 850 degrees Celsius may be utilized in some embodiments. Heating the multiple material layers may include heating the multiple layers to a temperature between 56% and 86% of the melting temperature of the multiple material layers. Some embodiments may include heating the multiple layers to a temperature between 65% and 75% of the melting temperature of the multiple material layers. Applying compressive pressure to the multiple material layers may include applying a pressure greater than or equal to 1,000 psi. In some embodiments, at least the heating or the compressive pressure applying occurs for 20 minutes or longer. Other compressive pressures, temperatures, and time durations may be utilized in some embodiments. It may also be of note that this process was been demonstrated to have equal effectiveness with aluminum and gold diffusion bonds, and other materials may also be utilized. Other temperatures, pressures, and times may be utilized in some embodiments.

Some embodiments may include multiple material layers, such as foil, fine wick mesh, coarse vapor mesh, fine vapor mesh and foil; see FIG. 4A and/or FIG. 4B, for example. FIG. 4B shows a cross section of the layers, where the excellent bond between the layers may be visualized. In some cases, it may be found that the edges of the copper foil create a preliminary seal even though the manufacturing fixture may not be designed to apply additional pressure on the edges.

Figure 8A:
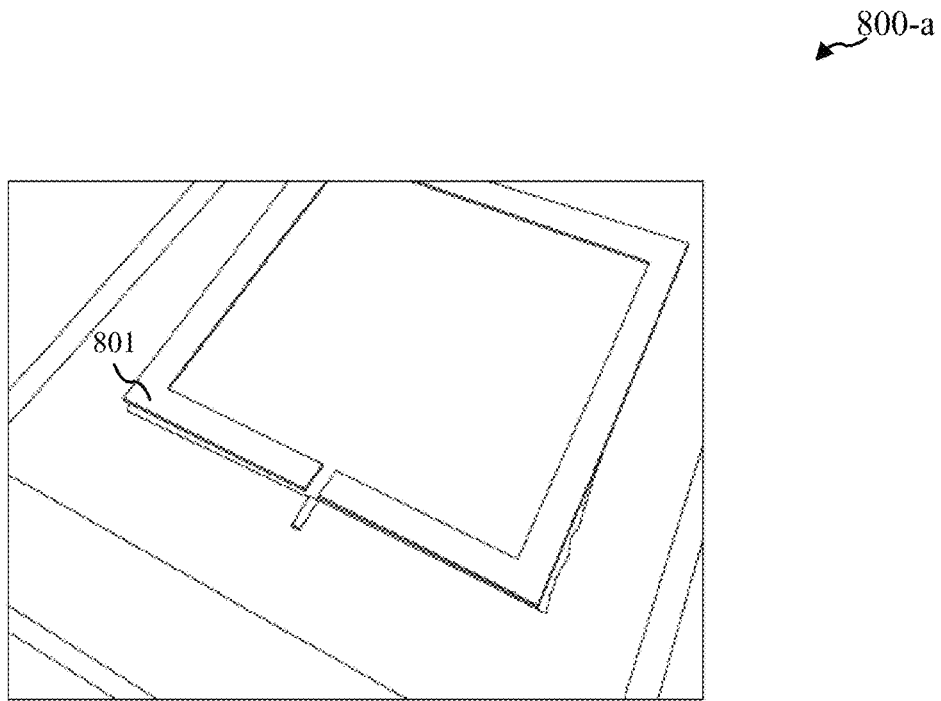
FIG. 8A, FIG. 8B, FIG. 8C, FIG. 8D, FIG. 8E, and FIG. 8F show devices in accordance with various embodiments.
Figure 8B:
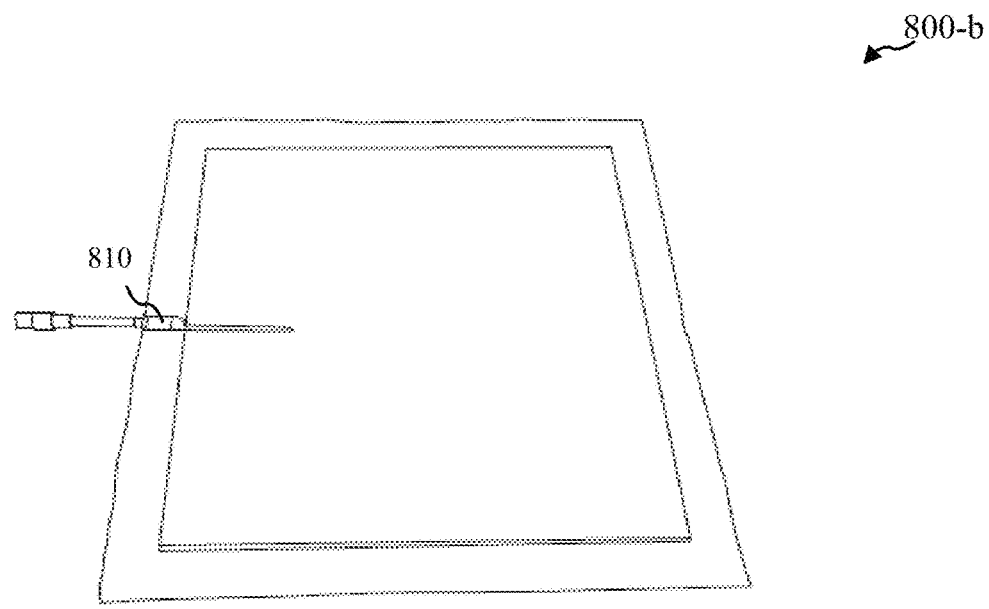
Figure 8C:
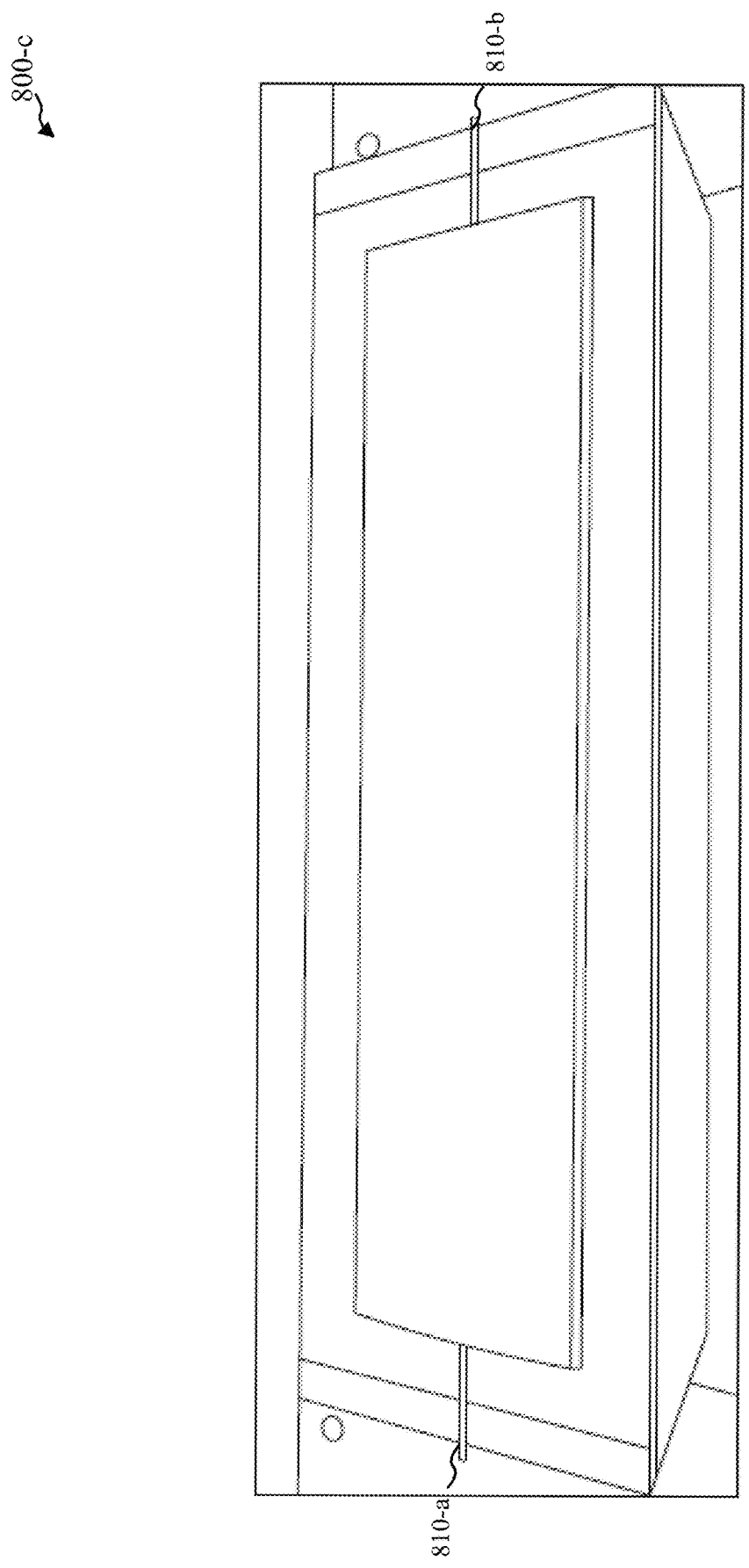

FIG. 8A, FIG. 8B, and FIG. 8C provide photographs of additional examples of devices 800-*a*, 800-*b*, and 800-*c*, respectively, in accordance with various embodiments that have been designed to include an edge seal. In some of these devices, an edge compression fixture 801 may be designed in order to create the edge seal in a single manufacturing step. For example, a portion of the first containment layer and a portion the second containment layer may be bonded with each other to form one or more seals for the device. In some cases, these devices may be assembled with a temporary insert 810 to allow for easy integration of a small metal tubing, or may include the metal tube itself. Device 800-*c* may show charging tubes 810-*a* and/or 810-*b*. Devices 800-*a*, 800-*b*, and/or 800-*c* may be constructed in particular such that they may be flexible or conformable. Device 800-*a*, device 800-*b*, and/or device 800-*c* may utilize aspects of those systems and/or devices shown in FIG. 1, FIG. 2A, FIG. 2B, FIG. 2C, FIG. 2D, FIG. 2E, FIG. 2F, FIG. 2G, FIG. 2H, FIG. 2I, FIG. 2J, FIG. 4A, FIG. 4B, FIG. 5A, FIG. 5B, FIG. 5C, FIG. 5D, FIG. 6, FIG. 7A, FIG. 7B, FIG. 8C, FIG. 8D, FIG. 8E, FIG. 8F, FIG. 9A, FIG. 9B, FIG. 10A, FIG. 10B, and/or FIG. 10C.

Figure 8D:
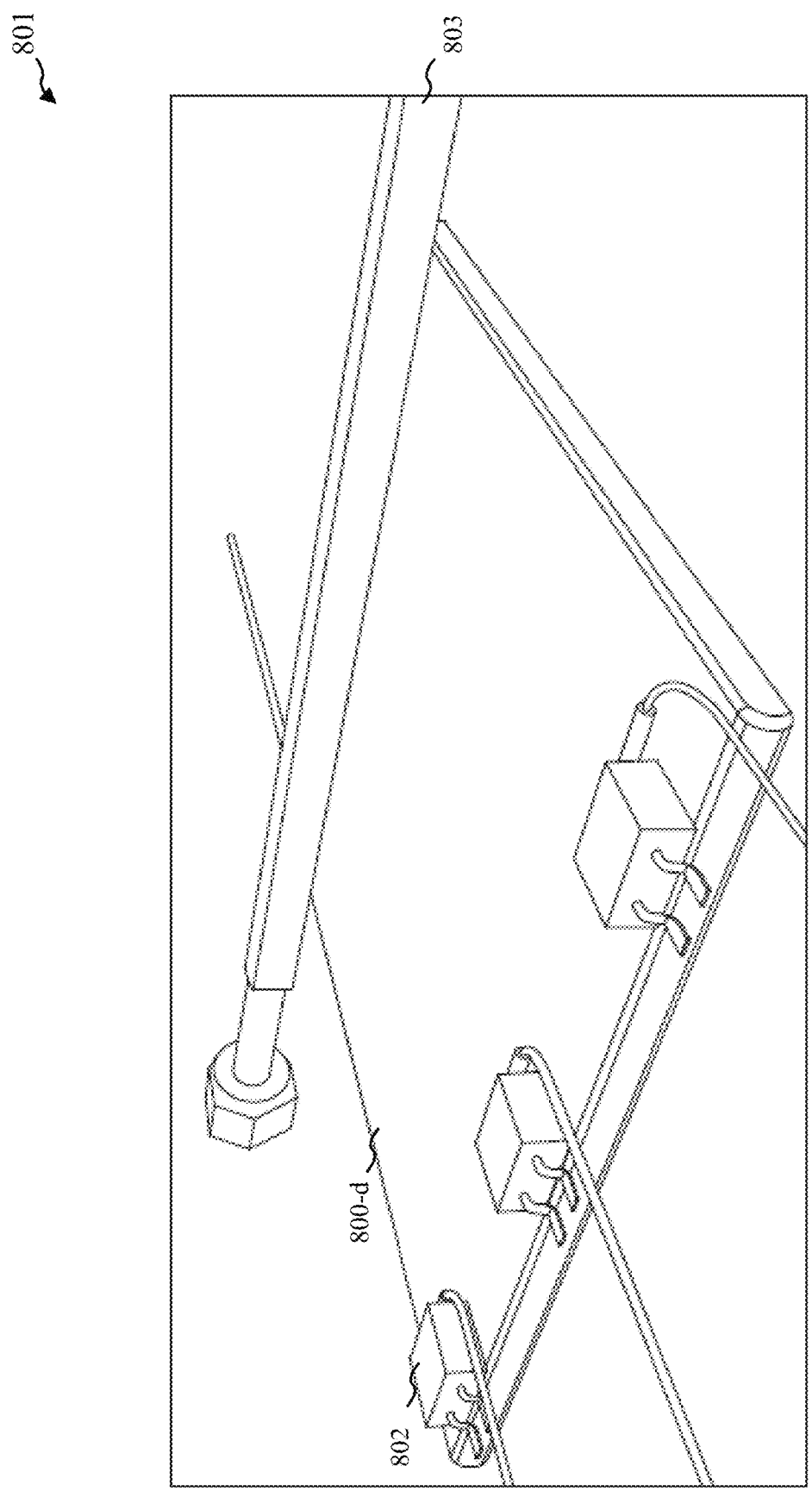
Figure 8E:
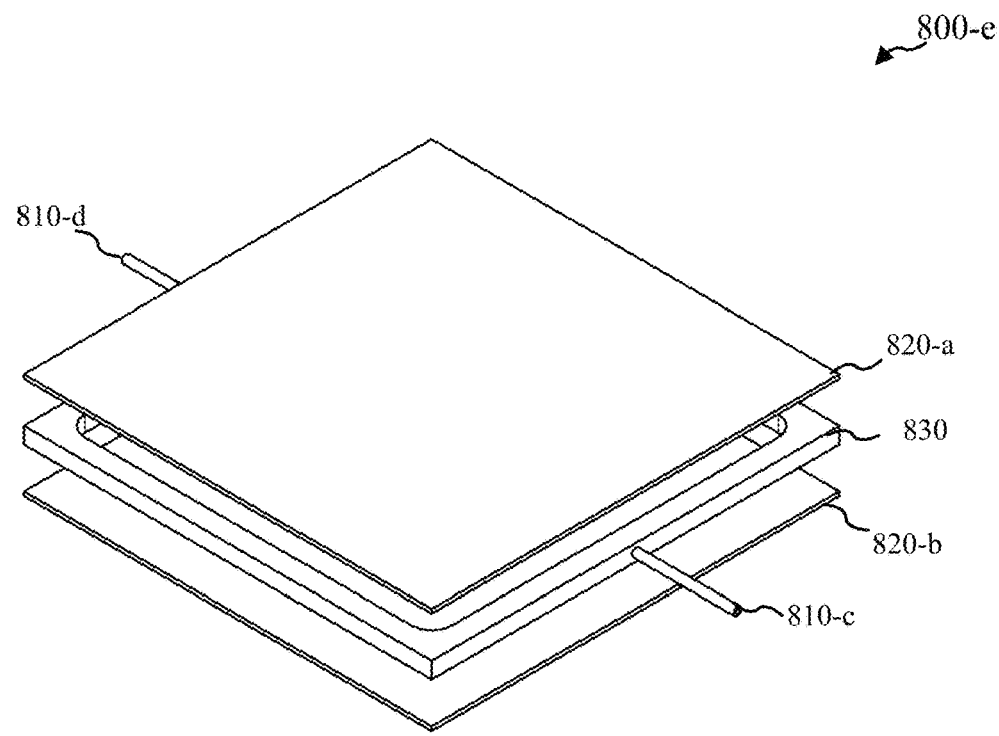
Figure 8F:
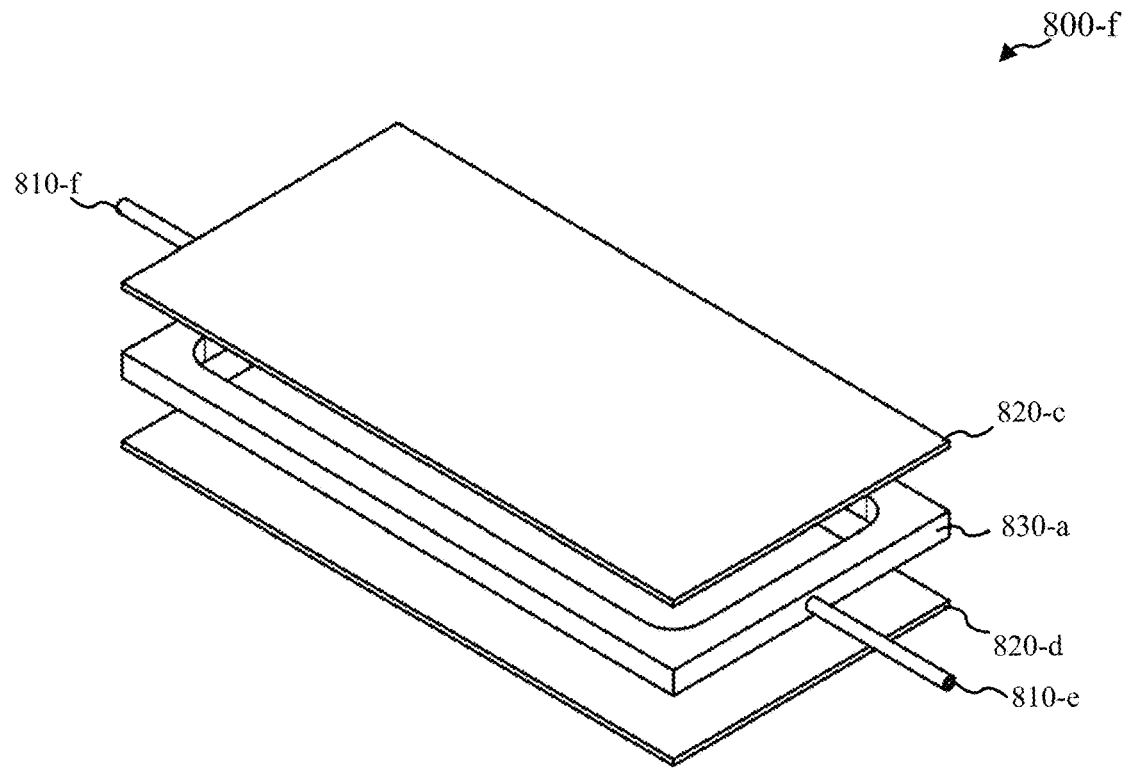

FIG. 8D shows a photograph of system 801 in accordance with various embodiments. In particular, system 801 may include a device 800-*d* that may provide an example of aspects of devices and/or systems shown in FIG. 1, FIG. 2A, FIG. 2B, FIG. 2C, FIG. 2D, FIG. 2E, FIG. 2F, FIG. 2G, FIG. 2H, FIG. 2I, FIG. 2J, FIG. 4A, FIG. 4B, FIG. 5A, FIG. 5B, FIG. 5C, FIG. 5D, FIG. 6, FIG. 7A, FIG. 7B, FIG. 8A, FIG. 8B, FIG. 8C, FIG. 9A, FIG. 9B, FIG. 10A, FIG. 10B, and/or FIG. 10C. System 801 may also show one or more heat sources 802 and one or more heat sinks 803. Devices 800-*d* may be constructed in particular such that they may be rigid and may in particular provide for heat spreading of the heat sources 802. FIG. 8E and FIG. 8F may provide exploded view of devices 800-*e* and 800-*f* in accordance with various embodiments. Device 800-*e*, in particular, may be an example device 800-*d* of FIG. 8D. Device 800-*e* may include two combined containment layer or outer casing with a hybrid wick 820-*a*/820-*b* along with one or more porous layers and/or window frame 830, which may provide a vapor core. Charging Tubes 810-*c*/810-*d* may also be showed. Device 800-*e* may be configured as a general square shape. Device 800-*f* may have a similar construction, which may include two combined containment layer or outer casing with a hybrid wick 820-*c*/820-*d* along with one or more porous layers and/or window frame 830-*a*. Charging Tubes 810-*e*/810-*f* may also be showed. Device 800-*f* may include a longer rectangular shape. The hybrid wicks may include two or more porous layers, where a first porous layer proximal to the containment layer may have fewer wires per unit length that a second porous layer positioned such that the first porous layer is between the containment layer and the second porous layer. The one or more porous layers associated with window frame 830-*a* may generally include fewer wires per unit length than the first porous layers and/or second porous layers associated with the hybrid wicks. Merely by way of example, in some embodiments, the containment layers may include a casing material approximately 0.03 inches thick and the hybrid wicking layers may include two copper mesh layers including a mesh-40 layer and a mesh-200 layer. In some embodiments, the one or more porous layers providing a vapor core may include a copper mesh layer utilizing mesh-10.

Different tools and techniques may be utilized to construct embodiments such as device 800-*d* and/or 800-*e*, in particular. For example, the hybrid wicks may be first created through diffusion bonding. A second diffusion bonding run may be utilized to bond the hybrid wicks with a vapor core between the hybrid wicks. In some embodiments, the vapor core may include a mesh, though the mesh may not be diffusion bonded to the hybrid wicks in some configurations. The edges of the bonded parts may be crimped in some cases, which may be utilized in preparation for edge welding. Utilizing a process of two sequential diffusion bonding runs may provide different benefits, such as tight dimensional control from flatness requirements. Larger quantities of hybrid wicks may also be achieved, which may achieve economies of scale.

Different tools and techniques may be utilized with respect charging the two-phase thermal management devices, such as devices 800-*a*, 800-*b*, 800-*c*, 800-*d*, and/or 800-*e* utilizing the one or more charging tubes 810. For example, a liquid fill and vapor-generation technique may be utilized. Charging may be at ambient temperature, with heating to boiling temperature in some cases. Other techniques may include evacuation, back-filling, and/or liquid-pulling techniques. For example, the two-phase thermal management device may be evacuated utilizing a vacuum pump. Full liquid filling may occur after boiling. Controlled liquid pull may be achieved using a syringe. A heater and different temperatures may be utilized to achieve desired charging levels.

In some embodiments, a charging level for a two-phase thermal management device may be determined utilizing the following procedure, though variations may be utilized. A heater, such as an electric-tape heater, may be placed on one end of the two-phase thermal management device. Two thermocouples may be placed on opposite ends of the two-phase thermal management device. The assembly of two-phase thermal management device, heater, and one thermocouple may be covered with insulation. Half of the two-phase management device may be left uncovered. The two-phase thermal management device may be filled with a working fluid. Once that the heater was turned on, temperature measurements from the thermocouples may be monitored. When the two-phase thermal management device may be completely full with working fluid, the two thermocouples may indicate a large temperature difference. A syringe may be used to pull a known amount of liquid, and the change in temperature may be monitored. As the two-phase thermal management device may begin to operate as a heat pipe, the temperature difference between the two thermocouples may decrease. Different orientations of the two-phase thermal management device may be utilized, such as vertical gravity assisted or horizontally.

Figure 9A:
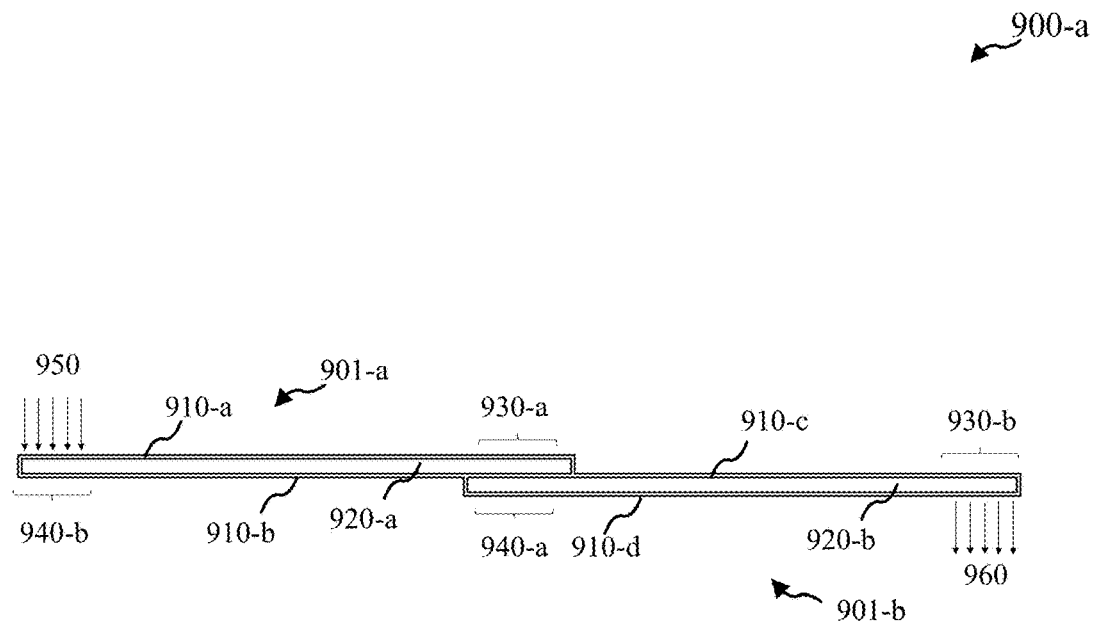
FIG. 9A and FIG. 9B show systems in accordance with various embodiments.
Figure 9B:
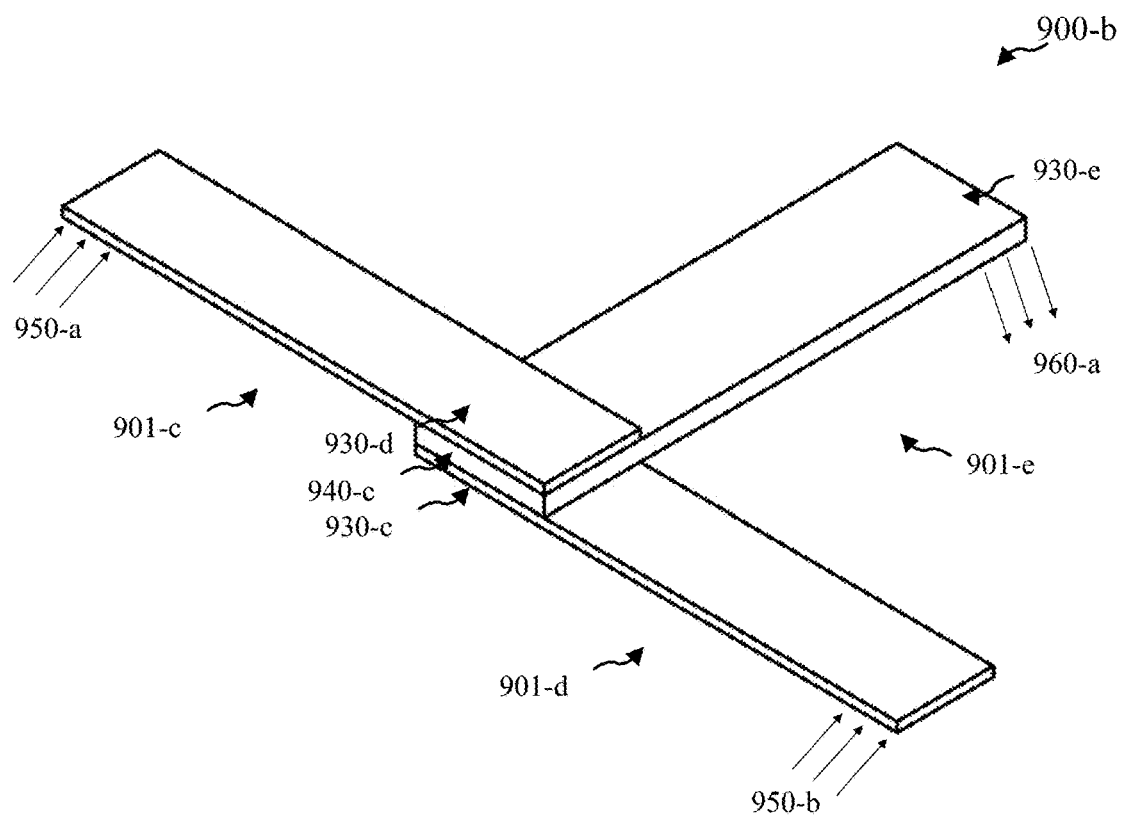

FIG. 9A and FIG. 9B provide examples of systems 900-*a* and 900-*b* in accordance with various embodiments that may involve multiple components configured in series. System 900-*a* and/or system 900-*b* may utilize aspects of those systems and/or devices shown in FIG. 1, FIG. 2A, FIG. 2B, FIG. 2C, FIG. 2D, FIG. 2E, FIG. 2F, FIG. 2G, FIG. 2H, FIG. 2I, FIG. 2J, FIG. 4A, FIG. 4B, FIG. 5A, FIG. 5B, FIG. 5C, FIG. 5D, FIG. 6, FIG. 7A, FIG. 7B, FIG. 8A, FIG. 8B, FIG. 8C, FIG. 8D, FIG. 8E, FIG. 8F, FIG. 10A, FIG. 10B, and/or FIG. 10C. For example, diffusion-bonding manufacturing techniques may be utilized to construct thermal management devices that are manufactured in series. FIG. 9A shows an example of two thermal management devices 901-*a* and 901-*b* sharing a common containment layer, such as a common copper foil, used as the casing. Devices 901-*a* and/or 901-*b* may be examples of two-phase thermal management devices of FIG. 1, FIG. 2A, FIG. 2B, FIG. 2C, FIG. 2D, FIG. 2E, FIG. 2F, FIG. 2G, FIG. 2H, FIG. 2I, FIG. 2J, FIG. 4A, FIG. 4B, FIG. 6, FIG. 7A, FIG. 7B, FIG. 8A, FIG. 8B, FIG. 8C, FIG. 8D, FIG. 8E, FIG. 10A, FIG. 10B, and/or FIG. 10C.

For example, system 900-*a* may include first two-phase thermal management device 901-*a* that may include a first containment layer 910-*a* and a second containment layer 910-*b*. Device 901-*a* may include one or more porous layers 920-*a* positioned between at least a portion of each of the first containment layer 910-*a* and the second containment layer 910-*b*. System 900-*a* may include a second two-phase thermal management device 901-*b* coupled with the first two-phase thermal management device 901-*a*. The second two-phase thermal management device 901-*b* may include a third containment layer 910-*c* and a forth containment layer 910-*d*. Device 901-*b* one or more porous layers 920-*b* positioned between at least a portion of each of the third containment layer 910-*c* and the fourth containment layer 910-*d*.

In some embodiments, the second containment layer 910-*b* of the first two-phase thermal management device 901-*a* is continuous with the third containment layer 910-*c* of the second two-phase thermal management device 901-*b*.

System 900-*a* may include a condenser region 930-*a* of the first two-phase thermal management device 901-*a* that overlaps with an evaporator region 940-*a* of the second two-phase thermal management device 901-*b*. Device 901-*a* may include an evaporator region 940-*b*. Device 901-*b* may include a condenser region 930-*b*. These evaporator regions 930 and condenser regions 940 may be located at different portions of each device 901-*a*/901-*b*. System 900-*a* may also show heat source region 950 and heat sink region 960.

The first thermal management device 901-*a* may collect the heat from the heat source region 950 at the evaporator region 940-*b*, and may transfer it to the second thermal management device 901-*b* by conduction through the containment layers 910-*b*/910-*c* between the condenser region 930-*a* and evaporator region 940-*a*. Finally, the heat may be rejected to a heat sink region 960 through the condenser region 930-*b*. This configuration may minimize the thermal resistance between two thermal management devices, while it may allow for the highly efficient longitudinal heat transfer inside the thermal management devices.

System 900-*b* may take advantage of the capabilities of the diffusion bonding technique through the use of a series of thermal management devices that may collect heat from multiple heat loads, and may transport the excess heat to a single heat sink. For example, system 900-*b* shows two thermal management devices 901-*c*/901-*d* that may be used for collecting heat from two heat loads 950-*a*/950-*b*, and transferring the heat to a single thermal management device 901-*e* and then to a heat sink 960-*a* from condenser region 930-*e*. In order to minimize the contact resistance, a similar arrangement to system 900-*a* may be used between condenser regions 930-*c*/930-*d*, and evaporator region 940-*c*, such that the only thermal resistance may be the conduction through the common containment layer.

FIG. 9B may provide an example of the use of a third two-phase thermal management device coupled with the first two-phase thermal management device and the second two-phase thermal management device, where the first two-phase thermal management device and the second two-phase thermal management device are configured to couple with one or more heat sources and the third two-phase thermal management device is configured to couple with a heat sink.

Systems such as system 900-*a* and/or 900-*b* may in general include a first containment layer, a second containment layer, and a third containment layer; and/or the one or more porous layers include at least a first porous layer positioned between at least a portion of the first containment layer and a portion of the second containment layer and at least a second porous layer positioned between at least a portion of the second containment layer and at least a portion of the third containment layer. In some configurations, the first containment layer, the second containment layer, and the third containment layer may be stacked with respect to each other perpendicularly to their main plane. The first containment layer and the third containment layer may be skewed with respect to each other. Furthermore, while diffusion bonding may be utilized to construct some devices in series, other construction techniques may be utilized in some cases.

Figure 10A:
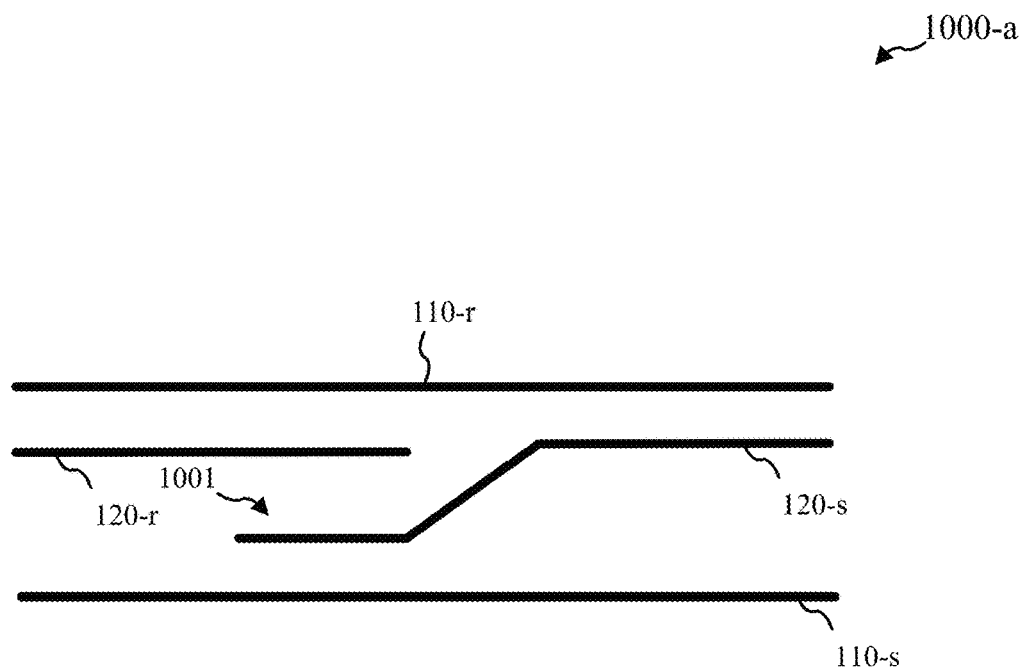
FIG. 10A, FIG. 10B, and FIG. 10C show devices in accordance with various embodiments.
Figure 10B:
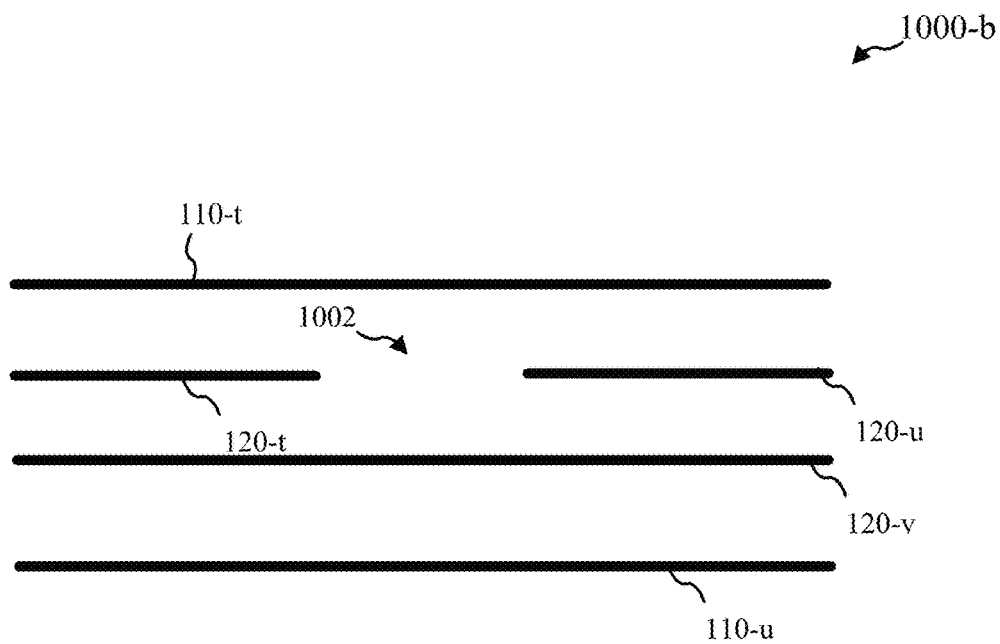
Figure 10C:
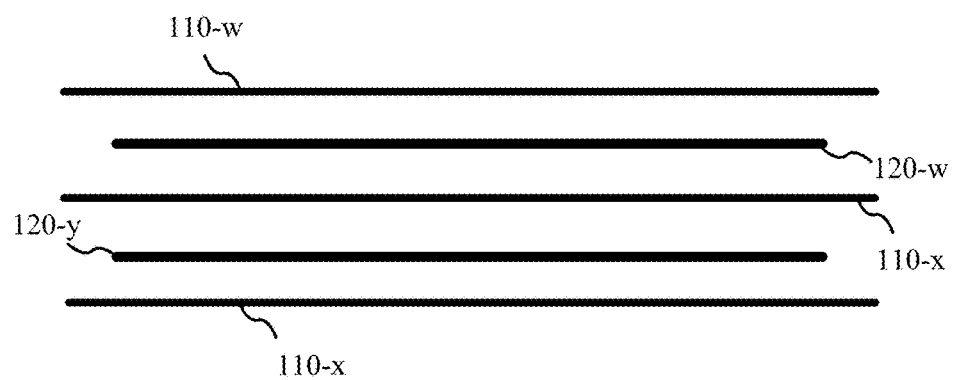

FIG. 10A, FIG. 10B, and FIG. 10C provide examples of devices 1000-*a*, 1000-*b*, and 1000-*c* in accordance with various embodiments that may involve different arrangements of the internal layers. Device 1000-*a*, device 1000-*b*, and/or device 1000-*c* may be examples of devices such as those shown and/or described with respect to FIG. 1, FIG. 2A, FIG. 2B, FIG. 2C, FIG. 2D, FIG. 2E, FIG. 2F, FIG. 2G, FIG. 2H, FIG. 2I, FIG. 2J, FIG. 4A, FIG. 4B, FIG. 5A, FIG. 5B, FIG. 5C, FIG. 5D, FIG. 6, FIG. 7A, FIG. 7B, FIG. 8A, FIG. 8B, FIG. 8C, FIG. 8D, FIG. 8E, FIG. 8F, FIG. 9A, and/or FIG. 9B. For example, in device 1000-*a*, two of the internal layers 120-*r*, 120-*s*, such as porous layers, may overlap over a region 1001, but not completely overlap each other; device 1000-*a* also may include two containment layers 110-*r* and 110-*s*. For example, one or more porous layers 120-*r* and/or 120-*s* may partially overlap. Device 1000-*b* may involve internal layers 120-*t*, 120-*u*, 120-*v*, such as porous layers, that may have one or more gaps 1002 with respect to the internal layers; device 1000-*a* also may include two containment layers 110-*t* and 110-*u*. Device 1000-*c* may be an example with a first containment layer 110-*w*, a second containment layer 110-*x*, and a third containment layer 110-*y* that may be stacked with respect to each other perpendicularly to their main plane. Device 1000-*c* may also show one or more porous layers 120-*w* and 120-*y*.

Figure 11A:
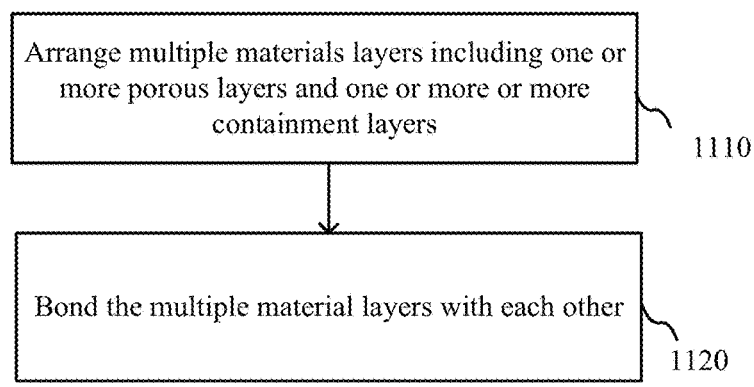
FIG. 11A shows a flow diagram of a method in accordance with various embodiments.

FIG. 11A shows a flow diagram of a method 1100-*a* of forming a two-phase thermal management device in accordance with various embodiments. Method 1100-*a* may be implemented utilizing a variety of systems and/or devices such as those shown and/or described with respect to FIG. 1, FIG. 2A, FIG. 2B, FIG. 2C, FIG. 2D, FIG. 2E, FIG. 2F, FIG. 2G, FIG. 2H, FIG. 2I, FIG. 2J, FIG. 4A, FIG. 4B, FIG. 5A, FIG. 5B, FIG. 5C, FIG. 5D, FIG. 6, FIG. 7A, FIG. 7B, FIG. 8A, FIG. 8B, FIG. 8C, FIG. 8D, FIG. 8E, FIG. 8F, FIG. 9A, FIG. 9B, FIG. 10A, FIG. 10B, and/or FIG. 10C, for example.

At block 1110, multiple materials layers may be arranged including one or more porous layers positioned and one or more containment layers. At block 1120, multiple material layers may be bonded with each other. In some embodiments, bonding the multiple material layers with each other occurs at least simultaneously or in a single manufacturing step.

In some embodiments of method of 1100-*a*, bonding the multiple material layers with each other utilizes diffusion bonding. The diffusion bonding may include at least heating the multiple material layers or applying compressive pressure to the multiple material layers. Heating the multiple material layers may include heating the multiple layers to a temperature greater than or equal to 850 degrees Celsius. Heating the multiple material layers may include heating the multiple layers to a temperature between 56% and 86% of a melting temperature of the multiple material layers. Applying compressive pressure to the multiple material layers may include applying a pressure greater than or equal to 1,000 psi. In some embodiments, at least the heating or the compressive pressure applying occurs for 20 minutes or longer.

Some embodiments of method 1100-*a* include sealing one or more edges of the two or more containment layers to one another. Some embodiments include utilizing a vacuum hot press to bond the multiple material layers with each other.

Some embodiments of method 1100-*a* include utilizing a charging tube between the two or more containment layers. Some embodiments include: injecting a working fluid between the two or more containment layers; and/or sealing at least a portion of the two or more containment layers with respect to a position of the charging tube between the two or more containment layers. In some embodiments, the working fluid includes at least ammonia, acetone, methanol, water, or ethyl alcohol. In some embodiments, the working fluid includes paraffin. Some embodiments include evacuating the two-phase thermal management device before allowing the working fluid to back fill the open space between the two or more containment layers due to the low internal pressure.

In some embodiments of method 1100-*a*, arranging the multiple material layers includes: positioning a first porous layer from the one or more porous layers between a first containment layer from the one or more containment layers and a second porous layer from the one or more porous layers; and/or positioning a third porous layer from the one or more porous layers between the second porous layer and a second containment layer from the one or more containment layers. In some embodiments, the first porous layer and the third porous layer include more wires per unit length than the second porous layer.

In some embodiments of method 1100-*a*, arranging the multiple material layers includes: positioning a first porous layer from the one or more porous layers between a first containment layer from the one or more containment layers and a second porous layer from the one or more porous layers; and/or positioning a third porous layer from the one or more porous layers between a fourth porous layer and a second containment layer from the one or more containment layers. In some embodiments, bonding the multiple material layers with each other includes: bonding the first porous layer from the one or more porous layers with the first containment layer from the one or more containment layers and the second porous layer from the one or more porous layers to form a first wicking structure; bonding the third porous layer from the one or more porous layers with the fourth porous layer and the second containment layer from the one or more containment layers to form a second wicking structure; and/or bonding the first wicking structure and the second wicking structure with each other, where at least a fifth porous structure or a vapor structure is positioned between the first wicking structure and the second wicking structure. In some embodiments, the first porous layer and the third porous layer include fewer wires per unit length than the second porous layer and the fourth porous layer. In some embodiments, the fifth porous structure includes fewer wires per unit length than at least the first porous layer, the second porous layer, the third porous layer, or the fourth porous layer.

Figure 11B:
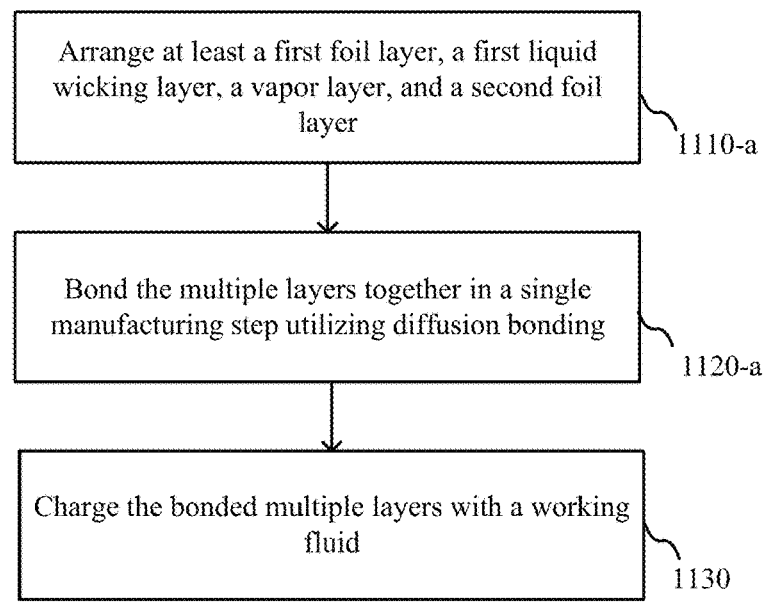
FIG. 11B shows a flow diagram of a method in accordance with various embodiments.

FIG. 11B shows a flow diagram of a method 1100-*b* of forming a two-phase thermal management device in accordance with various embodiments. Method 1100-*b* may be implemented utilizing a variety of systems and/or devices such as those shown and/or described with respect to FIG. 1, FIG. 2A, FIG. 2B, FIG. 2C, FIG. 2D, FIG. 2E, FIG. 2F, FIG. 2G, FIG. 2H, FIG. 2I, FIG. 2J, FIG. 4A, FIG. 4B, FIG. 5A, FIG. 5B, FIG. 5C, FIG. 5D, FIG. 6, FIG. 7A, FIG. 7B, FIG. 8A, FIG. 8B, FIG. 8C, FIG. 8D, FIG. 8E, FIG. 8F, FIG. 9A, FIG. 9B, FIG. 10A, FIG. 10B, and/or FIG. 10C, for example. Method 1100-*b* may be an example of method 1100-*a* of FIG. 11A.

At block 1110-*a*, at least a first foil layer, a first liquid wicking layer, a vapor layer, and a second foil layer may be arranged. Some embodiments may include arranging a second liquid wicking layer between the vapor layer and the second copper foil layer. At block 1120-*a*, the multiple layers may be bonded together in a single manufacturing step utilizing diffusion bonding. At block 1130, the bonded multiple layers may be charged with a working fluid.

Figure 11C:
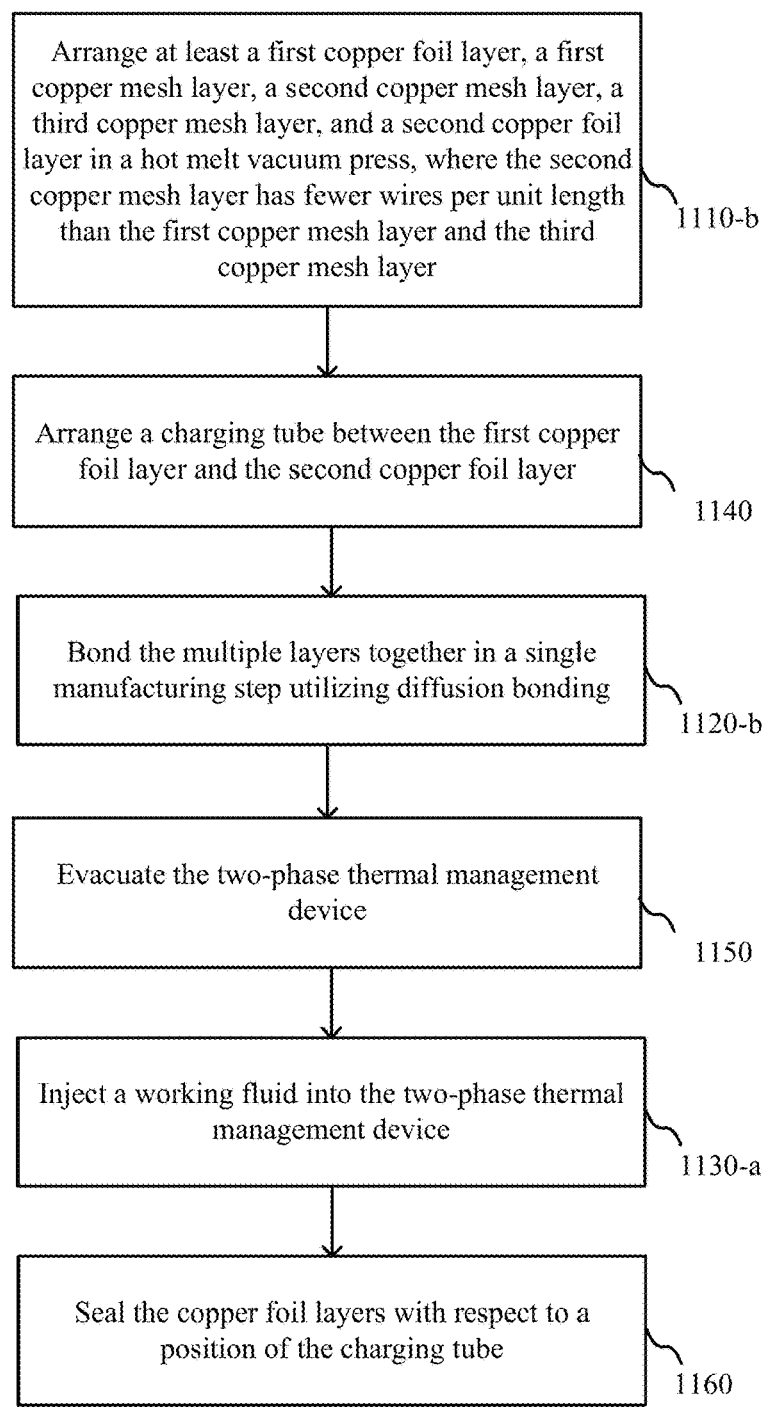
FIG. 11C shows a flow diagram of a method in accordance with various embodiments.

FIG. 11C shows a flow diagram of a method 1100-*c* of forming a two-phase thermal management device in accordance with various embodiments. Method 1100-*c* may be implemented utilizing a variety of systems and/or devices such as those shown and/or described with respect to FIG. 1, FIG. 2A, FIG. 2B, FIG. 2C, FIG. 2D, FIG. 2E, FIG. 2F, FIG. 2G, FIG. 2H, FIG. 2I, FIG. 2J, FIG. 4A, FIG. 4B, FIG. 5A, FIG. 5B, FIG. 5C, FIG. 5D, FIG. 6, FIG. 7A, FIG. 7B, FIG. 8A, FIG. 8B, FIG. 8C, FIG. 8D, FIG. 8E, FIG. 8F, FIG. 9A, FIG. 9B, FIG. 10A, FIG. 10B, and/or FIG. 10C, for example. Method 1100-*c* may be an example of method 1100-*a* of FIG. 11A and/or method 1100-*b* of FIG. 11B.

At block 1110-*b*, a first copper foil layer, a first mesh copper layer, a second mesh copper layer, a third mesh copper layer, and a second copper foil layer may be arranged in a vacuum hot press. The second copper mesh layer may have fewer wires per unit length than the first copper mesh layer and the third copper mesh layer. At block 1140, a charging tube may be arranged between the first copper foil layer and the second copper foil layer. At block 1120-*b*, the multiple layers may be bonded together in a single manufacturing step utilizing diffusion bonding. In some cases, the diffusion bonding process may produce a seal with respect to at least the copper foil layers. At block 1150, the two-phase thermal management device may be evacuated. At block 1130-*a*, a working fluid may be injected into the two-phase thermal management device. At block 1160, the copper foil layers may be sealed with respect to a position of the charging tube.

Figure 11D:
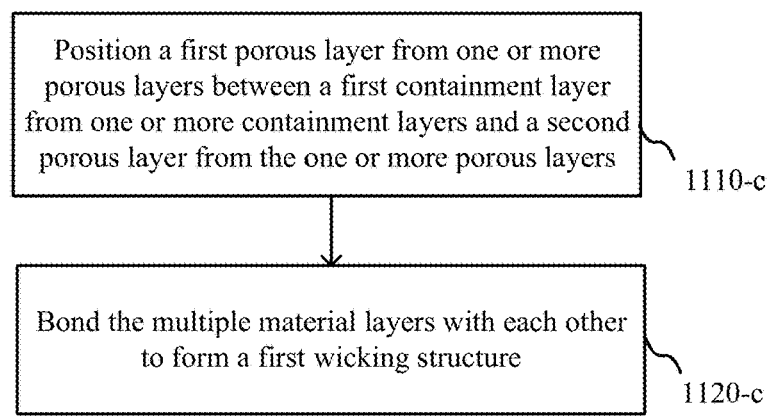
FIG. 11D shows a flow diagram of a method in accordance with various embodiments.

FIG. 11D shows a flow diagram of a method 1100-*d* of forming a two-phase thermal management device in accordance with various embodiments. Method 1100-*d* may be implemented utilizing a variety of systems and/or devices such as those shown and/or described with respect to FIG. 1, FIG. 2A, FIG. 2B, FIG. 2C, FIG. 2D, FIG. 2E, FIG. 2F, FIG. 2G, FIG. 2H, FIG. 2I, FIG. 2J, FIG. 4A, FIG. 4B, FIG. 5A, FIG. 5B, FIG. 5C, FIG. 5D, FIG. 6, FIG. 7A, FIG. 7B, FIG. 8A, FIG. 8B, FIG. 8C, FIG. 8D, FIG. 8E, FIG. 8F, FIG. 9A, FIG. 9B, FIG. 10A, FIG. 10B, and/or FIG. 10C, for example. Method 1100-*d* may be an example of aspects of method 1100-*a* of FIG. 11A, method 1100-*b* of FIG. 11A, and/or method 1100-*c* of FIG. 11C.

At block 1110-*c*, a first porous layer from one or more porous layers may be positioned and/or arranged between a first containment layer from one or more containment layers and a second porous layer from the one or more porous layers. At block 1120-*c*, the multiple material layers may be bonded with each other to form a first wicking structure.

Figure 11E:
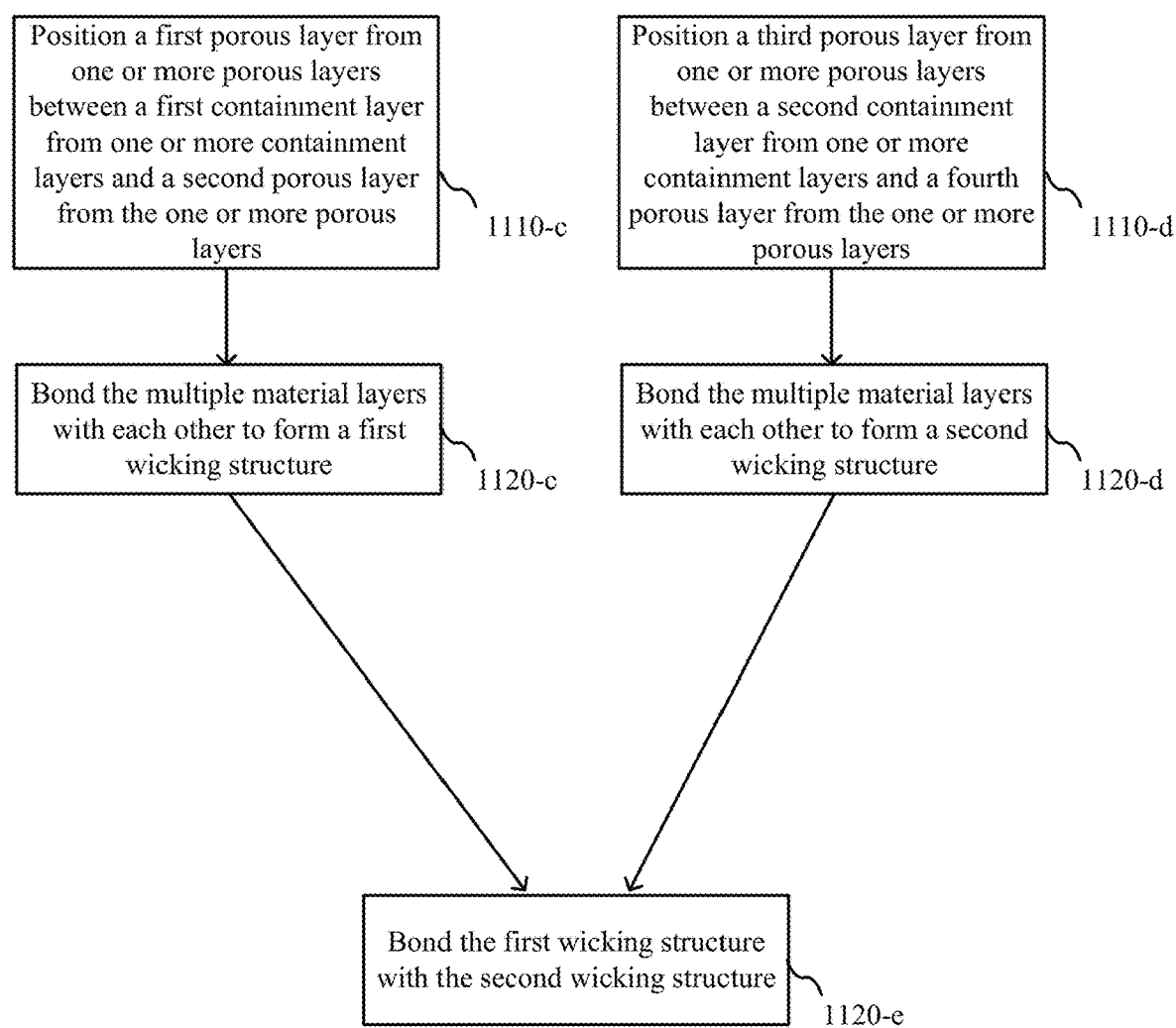
FIG. 11E shows a flow diagram of a method in accordance with various embodiments.

FIG. 11E shows a flow diagram of a method 1100-*e* of forming a two-phase thermal management device in accordance with various embodiments. Method 1100-*e* may be implemented utilizing a variety of systems and/or devices such as those shown and/or described with respect to FIG. 1, FIG. 2A, FIG. 2B, FIG. 2C, FIG. 2D, FIG. 2E, FIG. 2F, FIG. 2G, FIG. 2H, FIG. 2I, FIG. 2J, FIG. 4A, FIG. 4B, FIG. 5A, FIG. 5B, FIG. 5C, FIG. 5D, FIG. 6, FIG. 7A, FIG. 7B, FIG. 8A, FIG. 8B, FIG. 8C, FIG. 8D, FIG. 8E, FIG. 8F, FIG. 9A, FIG. 9B, FIG. 10A, FIG. 10B, and/or FIG. 10C, for example. Method 1100-*e* may be an example of aspects of method 1100-*a* of FIG. 11A, method 1100-*b* of FIG. 11A, and/or method 1100-*c* of FIG. 11C. Method 1100-*e* may be an example of method 1100-*d* of FIG. 1D.

At block 1110-*c*, a first porous layer from one or more porous layers may be positioned and/or arranged between a first containment layer from one or more containment layers and a second porous layer from the one or more porous layers. At block 1120-*c*, the multiple material layers may be bonded with each other to form a first wicking structure. Similarly, at block 1110-*d*, a third porous layer from one or more porous layers may be positioned and/or arranged between a second containment layer from one or more containment layers and a fourth porous layer from the one or more porous layers. At block 1120-*d*, the multiple material layers may be bonded with each other to form a second wicking structure. At block 1120-*e*, the first wicking structure may be bonded with the second wicking structure; diffusion bonding, for example, may be utilized. In some embodiments, a vapor core and/or window frame may be utilized between at least a portion of the first wicking structure and the second wicking structure.

These embodiments may not capture the full extent of combination and permutations of materials and process equipment. However, they may demonstrate the range of applicability of the method, devices, and/or systems. The different embodiments may utilize more or less stages than those described.

It should be noted that the methods, systems and devices discussed above are intended merely to be examples. It must be stressed that various embodiments may omit, substitute, or add various procedures or components as appropriate. For instance, it should be appreciated that, in alternative embodiments, the methods may be performed in an order different from that described, and that various stages may be added, omitted or combined. Also, features described with respect to certain embodiments may be combined in various other embodiments. Different aspects and elements of the embodiments may be combined in a similar manner. Also, it should be emphasized that technology evolves and, thus, many of the elements are exemplary in nature and should not be interpreted to limit the scope of the invention.

Specific details are given in the description to provide a thorough understanding of the embodiments. However, it will be understood by one of ordinary skill in the art that the embodiments may be practiced without these specific details. For example, well-known circuits, processes, algorithms, structures, and techniques have been shown without unnecessary detail in order to avoid obscuring the embodiments.

Also, it is noted that the embodiments may be described as a process which may be depicted as a flow diagram or block diagram or as stages. Although each may describe the operations as a sequential process, many of the operations can be performed in parallel or concurrently. In addition, the order of the operations may be rearranged. A process may have additional stages not included in the figure.

Having described several embodiments, it will be recognized by those of skill in the art that various modifications, alternative constructions, and equivalents may be used without departing from the spirit of the different embodiments. For example, the above elements may merely be a component of a larger system, wherein other rules may take precedence over or otherwise modify the application of the different embodiments. Also, a number of stages may be undertaken before, during, or after the above elements are considered. Accordingly, the above description should not be taken as limiting the scope of the different embodiments.

What is claimed is:

1. A method of forming a two-phase thermal management device comprising:
arranging a plurality of material layers including at least a first metal mesh and a second metal mesh, wherein the first metal mesh is coarser than the second metal mesh;
bonding at least the first metal mesh with the second metal mesh utilizing diffusion bonding;
positioning at least the first metal mesh bonded with the second metal mesh between a first containment layer and a second containment layer;
bonding at least the first metal mesh, the second metal mesh, the first containment layer, and the second containment layer with each other utilizing diffusion bonding;
sealing one or more edges of the first containment layer with the second containment layer with each other;
positioning a charging tube between the first containment layer and the second containment layer;
injecting a working fluid between the first containment layer and the second containment layer through the charging tube; and
sealing at least a portion of the first containment layer and the second containment layer with respect to a position of the charging tube after injecting the working fluid between the first containment layer and the second containment layer through the charging tube.

2. The method of claim 1, wherein at least:
bonding at least the first metal mesh with the second metal mesh utilizing the diffusion bonding includes at least heating the first metal mesh and the second metal mesh or apply compressive pressure to the first metal mesh and the second metal mesh; or
bonding at least the first metal mesh, the second metal mesh, the first containment layer, and the second containment layer with each other utilizing the diffusion bonding includes at least heating the first metal mesh, the second metal mesh, the first containment layer, and the second containment layer or apply compressive pressure to the first metal mesh, the second metal mesh, the first containment layer, and the second containment layer.

3. The method of claim 2, wherein the heating of the plurality of material layers includes heating the plurality of material layers to a temperature between 56% and 86% of a melting temperature of the plurality of material layers.

4. The method of claim 2, wherein the heating of the plurality of material layers includes heating the plurality of material layers to a temperature greater than or equal to 850 degrees Celsius.

5. The method of claim 2, wherein the applying of the compressive pressure to the plurality of material layers includes applying a pressure greater than or equal to 1,000 psi.

6. The method of claim 2, wherein at least the heating or the compressive pressure applying occurs for 20 minutes or longer.

7. The method of claim 1, wherein the working fluid includes at least ammonia, acetone, methanol, water, or ethyl alcohol.

8. The method of claim 1, wherein the working fluid includes paraffin.

9. The method of claim 1, further comprising evacuating the two-phase thermal management device before injecting the working fluid between the first containment layer and the second containment layer through the charging tube.

10. The method of claim 1, wherein arranging the plurality of material layers includes arranging a third metal mesh with respect to the first metal mesh and the second metal mesh such that the first metal mesh is between the second metal mesh and the third metal mesh, wherein the first metal mesh is coarser than the third metal mesh; and wherein the bonding of at least the first metal mesh with the second metal mesh utilizing the diffusion bonding includes diffusion bonding the third metal mesh with the second metal mesh.

\* \* \* \* \*